(12) United States Patent
Duriez et al.

(10) Patent No.: US 11,967,647 B2
(45) Date of Patent: Apr. 23, 2024

(54) LOCALIZED HEATING IN LASER ANNEALING PROCESS

(71) Applicant: Taiwan Semiconductor Manufacturing Co., Ltd., Hsinchu (TW)

(72) Inventors: Blandine Duriez, Brussels (BE); Marcus Johannes Henricus Van Dal, Linden (BE); Martin Christopher Holland, San Jose, CA (US); Gerben Doornbos, Kessel-Lo (BE); Georgios Vellianitis, Heverlee (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 135 days.

(21) Appl. No.: 17/361,141

(22) Filed: Jun. 28, 2021

(65) Prior Publication Data
US 2021/0328068 A1    Oct. 21, 2021

Related U.S. Application Data

(63) Continuation of application No. 16/588,453, filed on Sep. 30, 2019, now Pat. No. 11,069,813.

(51) Int. Cl.
*H01L 29/786* (2006.01)
*H01L 21/268* (2006.01)
(Continued)

(52) U.S. Cl.
CPC ...... *H01L 29/78618* (2013.01); *H01L 21/268* (2013.01); *H01L 21/28568* (2013.01); (Continued)

(58) Field of Classification Search
CPC ............. H01L 29/785; H01L 29/66795; H01L 29/7848; H01L 29/78618; H01L 21/268; (Continued)

(56) References Cited

U.S. PATENT DOCUMENTS 4,468,855 A *  9/1984  Sasaki ................... H01L 21/268
                                                          438/301
5,605,842 A    2/1997  Langley et al.
(Continued)

FOREIGN PATENT DOCUMENTS

| | | |
|---|---|---|
| CN | 106531719 A | 3/2017 |
| JP | H0258216 A | 2/1990 |

*Primary Examiner* — Ratisha Mehta
(74) *Attorney, Agent, or Firm* — Seed IP Law Group

(57) ABSTRACT

A method of forming a semiconductor device includes forming source/drain contact openings extending through at least one dielectric layer to expose source/drain contact regions of source/drain structures. The method further includes forming conductive plugs in the source/drain contact openings. The method further includes depositing a light blocking layer over the conductive plugs and the at least one dielectric layer. The method further includes etching the light blocking layer to expose the conductive plugs. The method further includes directing a laser irradiation to the conductive plugs and the light blocking layer. The laser irradiation is configured to activate dopants in the source/drain contact regions.

20 Claims, 25 Drawing Sheets

(51) Int. Cl.
*H01L 21/285* (2006.01)
*H01L 21/311* (2006.01)
*H01L 21/324* (2006.01)
*H01L 29/06* (2006.01)
*H01L 29/423* (2006.01)
*H01L 29/45* (2006.01)
*H01L 29/66* (2006.01)

(52) U.S. Cl.
CPC ...... *H01L 21/31116* (2013.01); *H01L 21/324* (2013.01); *H01L 29/0673* (2013.01); *H01L 29/42392* (2013.01); *H01L 29/45* (2013.01); *H01L 29/66515* (2013.01); *H01L 29/66742* (2013.01); *H01L 29/78696* (2013.01)

(58) Field of Classification Search
CPC ......... H01L 21/28568; H01L 21/31116; H01L 21/324; H01L 29/0673; H01L 29/42392; H01L 29/45; H01L 29/66515; H01L 29/66742; H01L 29/78696
See application file for complete search history.

(56) References Cited

U.S. PATENT DOCUMENTS

| | | |
|---|---|---|
| 5,605,847 A | 2/1997 | Zhang |
| 6,221,726 B1* | 4/2001 | Weiner ............... H01L 21/268 |
| | | 257/E21.336 |
| 6,630,977 B1 | 10/2003 | Yamazaki et al. |
| 9,548,381 B1 | 1/2017 | Krishnan et al. |
| 10,062,692 B1 | 8/2018 | Ray et al. |
| 10,134,856 B2 | 11/2018 | Eom et al. |
| 11,069,813 B2* | 7/2021 | Duriez ............... H01L 29/7848 |
| 2002/0042196 A1* | 4/2002 | Lee ................... H01L 21/76897 |
| | | 257/E21.507 |
| 2006/0211187 A1* | 9/2006 | Choi ................. H01L 21/28123 |
| | | 257/E21.306 |
| 2009/0057759 A1 | 3/2009 | Obradovic et al. |
| 2013/0288438 A1 | 10/2013 | Jensen et al. |
| 2013/0330923 A1* | 12/2013 | Lin .................... H01L 21/76805 |
| | | 438/666 |
| 2014/0315356 A1 | 10/2014 | Hashimoto et al. |
| 2016/0013313 A1* | 1/2016 | Cheng ................. H01L 29/0847 |
| | | 257/408 |
| 2016/0204061 A1 | 7/2016 | Yiu et al. |
| 2019/0173264 A1* | 6/2019 | Stojetz ................ H01S 5/3201 |
| 2019/0361290 A1* | 11/2019 | Li ....................... G03F 7/0007 |
| 2019/0393295 A1* | 12/2019 | Moy ................... H01L 51/5284 |

* cited by examiner

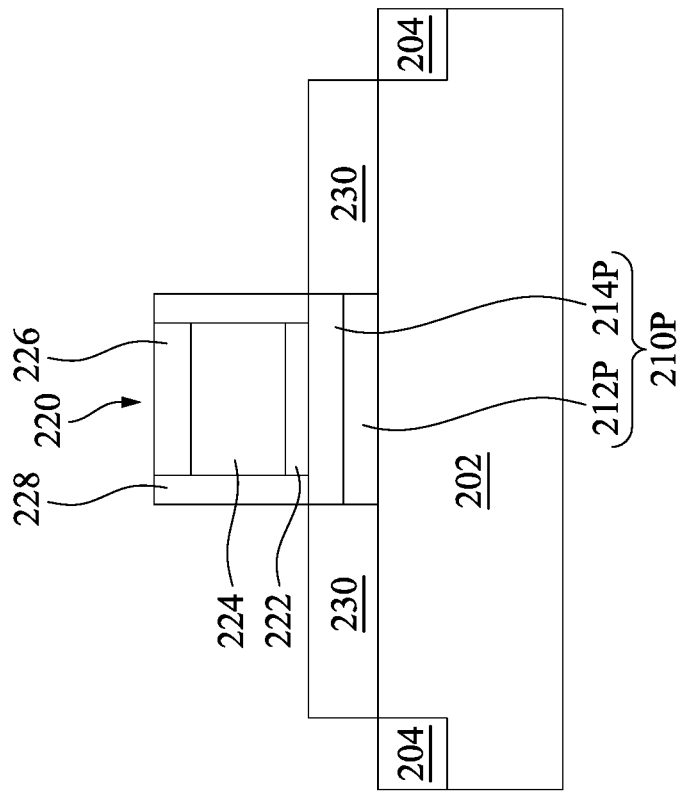

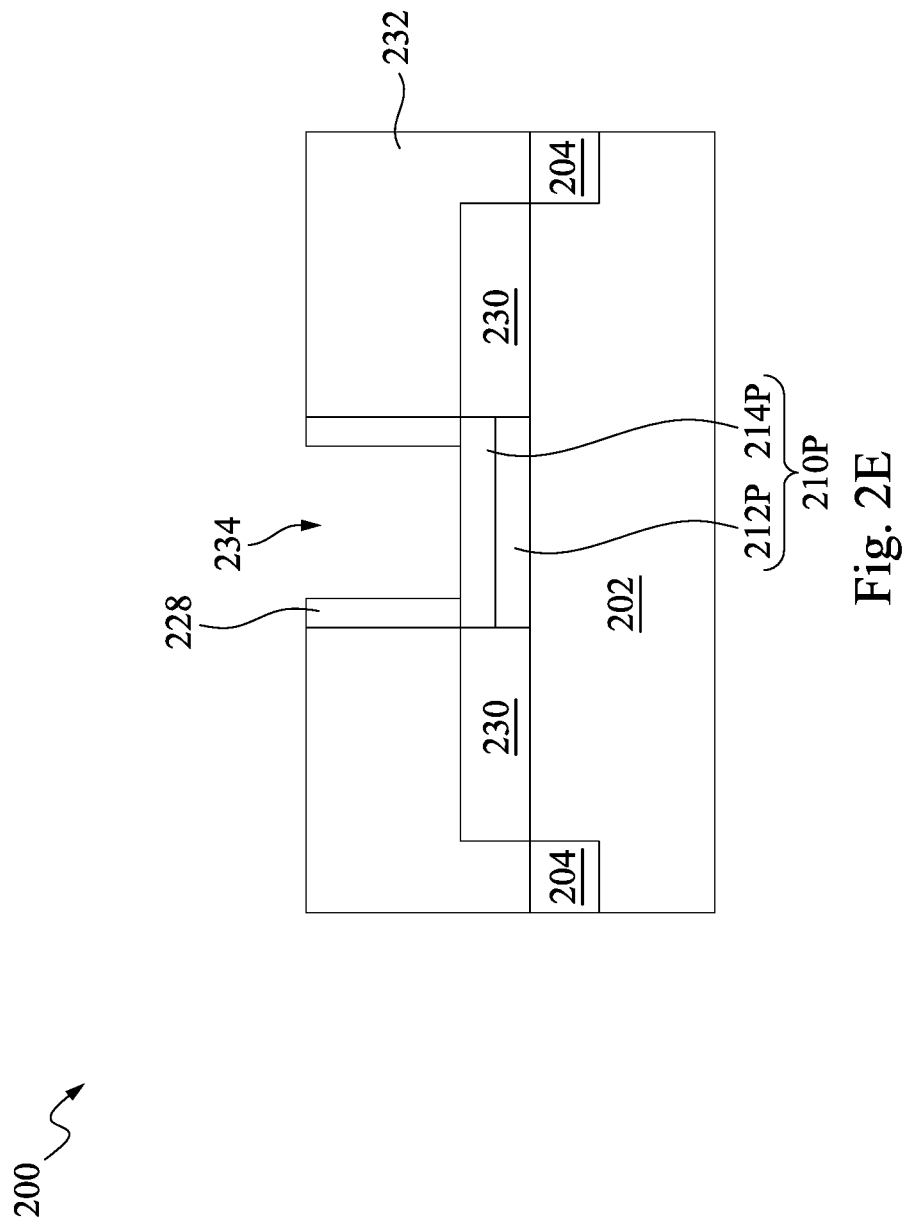

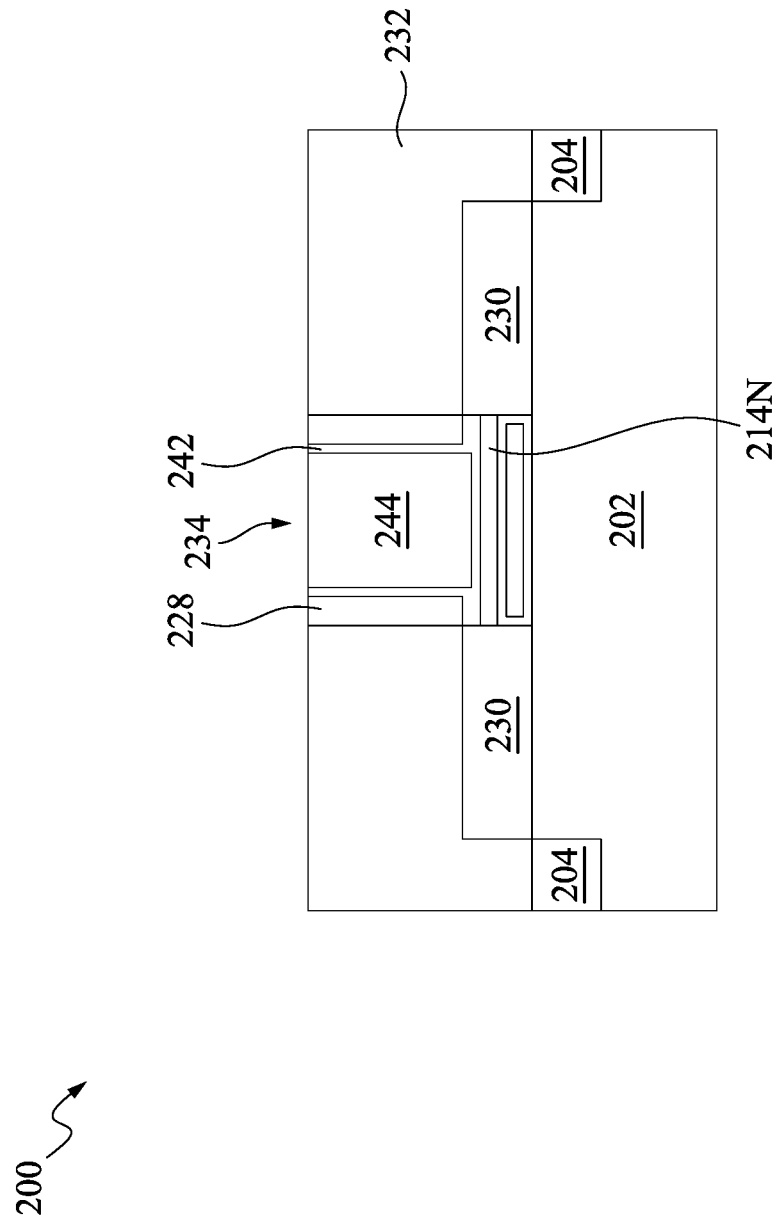

LOCALIZED HEATING IN LASER
ANNEALING PROCESS

BACKGROUND

Transistors are key components of integrated circuits. To satisfy the requirements of increasingly faster switching speed, drive currents of transistors need to be increasingly higher. As device size scales, contact resistance between source/drain contacts and source/drain structures of a transistor becomes a factor limiting device performance. High contact resistance causes the device drive currents to reduce, which in turn degrades transistor performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
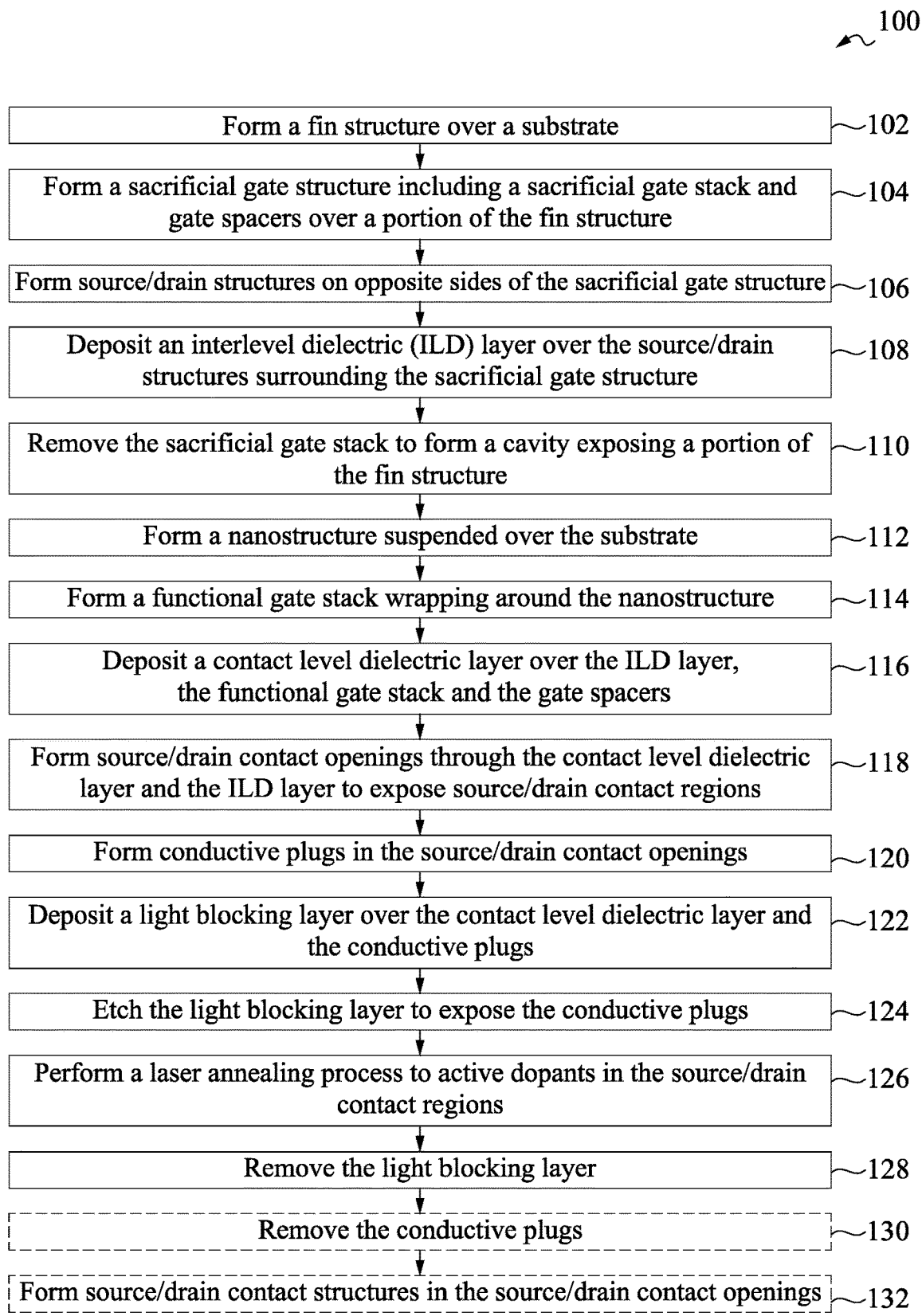
FIG. 1 is a flowchart of a method for fabricating a semiconductor FET device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In typical field effect transistor (FET) devices, source/drain contacts are created by forming metal contacts on top of source/drain structures containing activated dopants such as phosphorous (P) or Arsenic (As) in the case of n-type FET devices and boron (B) in case of p-type FET devices. The contact resistance between the metal contacts and the source/drain structures, thus, depends on the level of activated dopants in the source/drain contact regions proximate the metal/semiconductor interfaces.

A pulsed laser annealing process is commonly used to activate dopants in the source/drain contact regions. However, the laser energy that is required for achieving sufficient dopant activation normally exceeds the desired thermal budget, causing the melting of the semiconductor channel, especially when semiconductor channel has a small dimension in case of nanowire, nanosheet, or nanobar. The melting of the semiconductor channel is detrimental to the device performance and reliability. The laser energy also heats the metal gate formed by the gate-last scheme, which adversely affects the integrity of the metal gate.

The present disclosure provides methods that allow preventing thermal damage to gate and semiconductor channel during a laser annealing process for activating dopants in the source/drain contact regions, while maintaining high dopant activation efficiency. After forming conductive plugs which have high thermal conductivity in the source/drain contact openings to contact source/drain contact regions of a semiconductor FET device and forming a light block layer to cover regions where the metal gate and semiconductor channel are located, while exposing the conductive plugs, a laser irradiation for activating dopants in the source/drain contact regions is directed to the conductive plugs and the light blocking layer. The light blocking layer functions as a protection layer helping to prevent the gate and semiconductor channel from thermal damage by the laser irradiation. In the meanwhile, the conductive plugs function as local heat conductors to dissipate heat to the underlying source/drain contact regions, which helps to facilitate the dopant activation. The combination of the conductive plugs and the light blocking layer helps to confine heat to the source/drain contact regions to achieve improved local dopant activation efficiency, without heating other areas thus avoiding unwanted dopant diffusion and degradation of the gate and semiconductor channel. As a result, reliability of the semiconductor device is increased.

In the present disclosure, nanostructure (e.g., nanowire, nanosheet, or nanobar) FET devices and the method of forming the same are provided in accordance with various embodiments. The intermediate stages of forming the nanostructure FET devices are illustrated. The variations and the operations of the nanostructure FET devices in accordance with embodiments are discussed. Throughout the various views and illustrative embodiments, like reference numbers are used to designate like elements. Although embodiments described herein are described in the context of nanostructure FET devices, implementations of some embodiments of the present disclosure are usable in other processes and/or in other devices, such planar FET devices or fin FET devices.

Figure 2A:
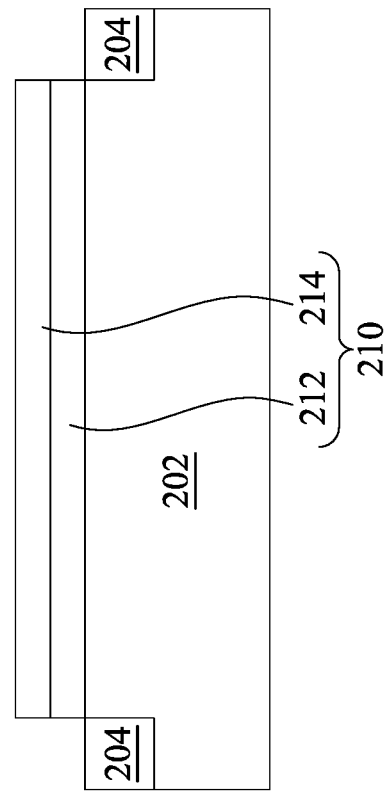
FIGS. 2A-2P are cross-sectional views of a semiconductor FET device at various stages of the fabrication process, in accordance with some embodiments.
Figure 2B:
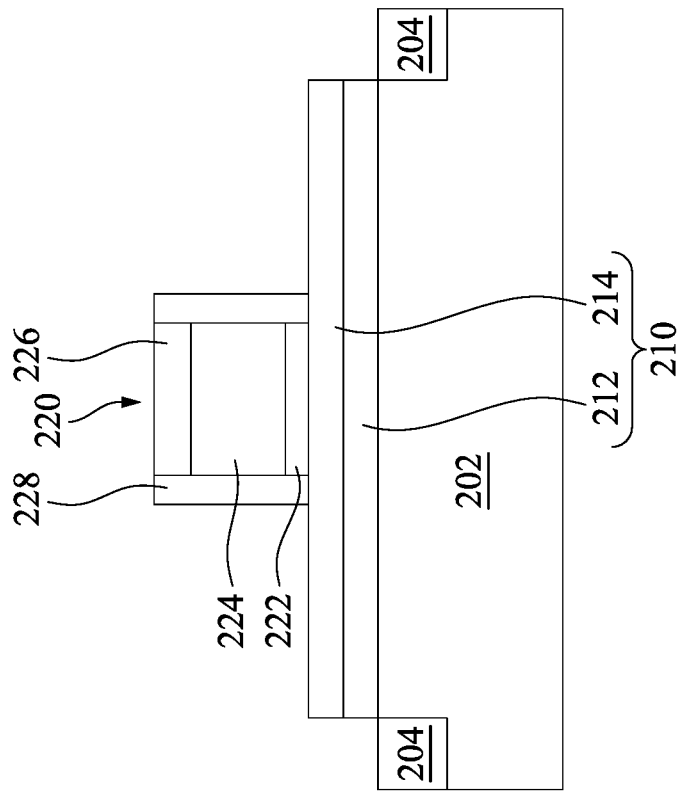
Figure 2D:
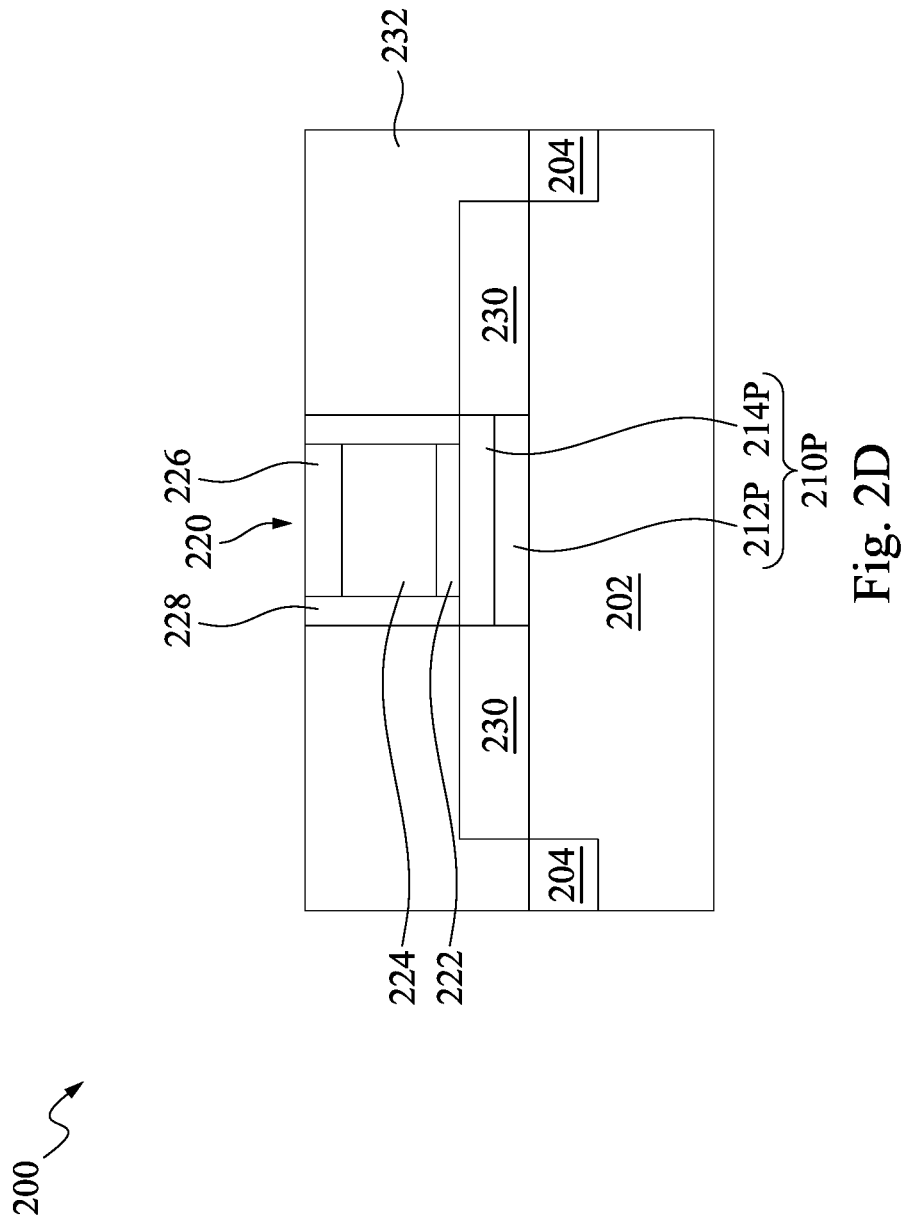
Figure 2F:
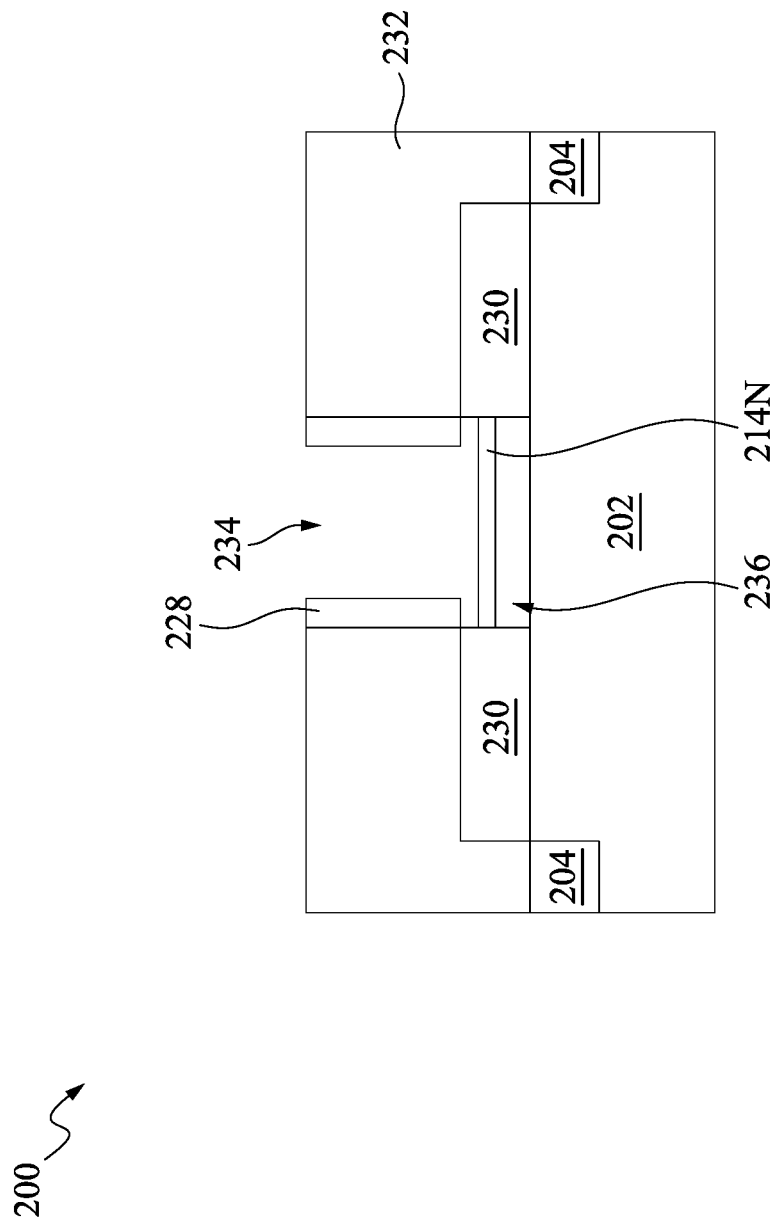
Figure 2H:
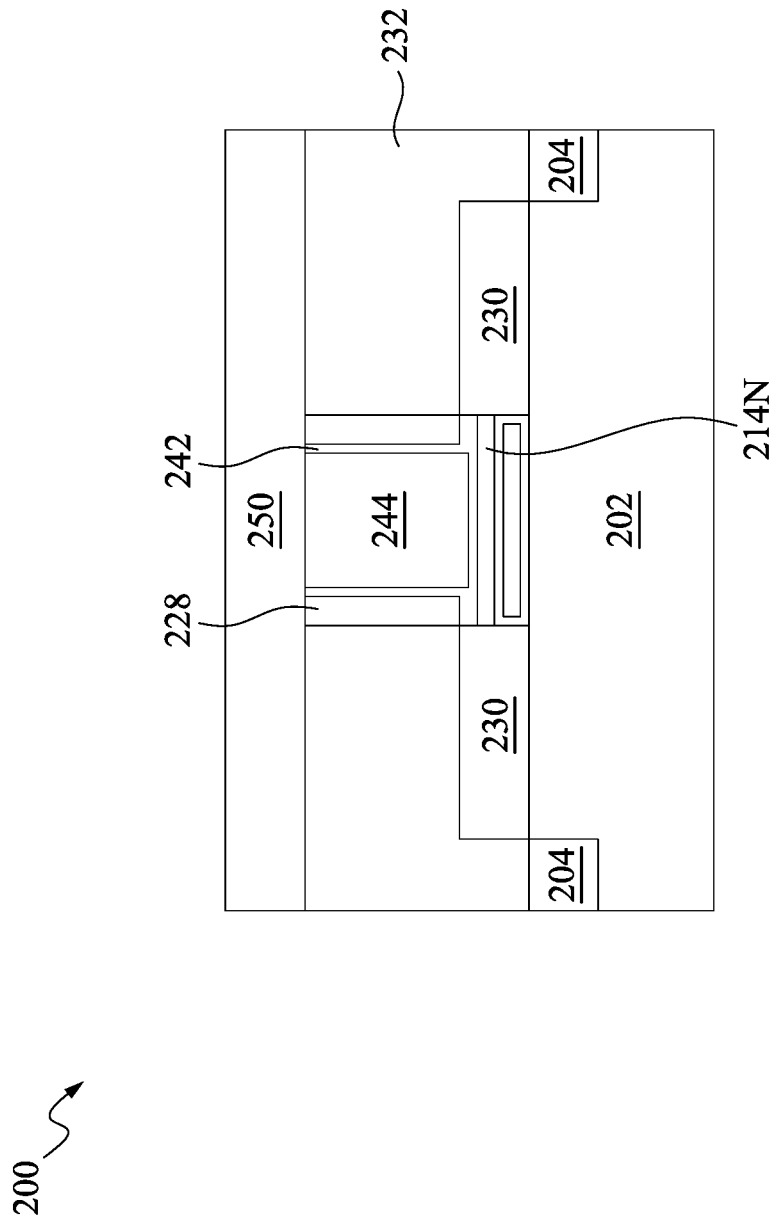
Figure 2I:
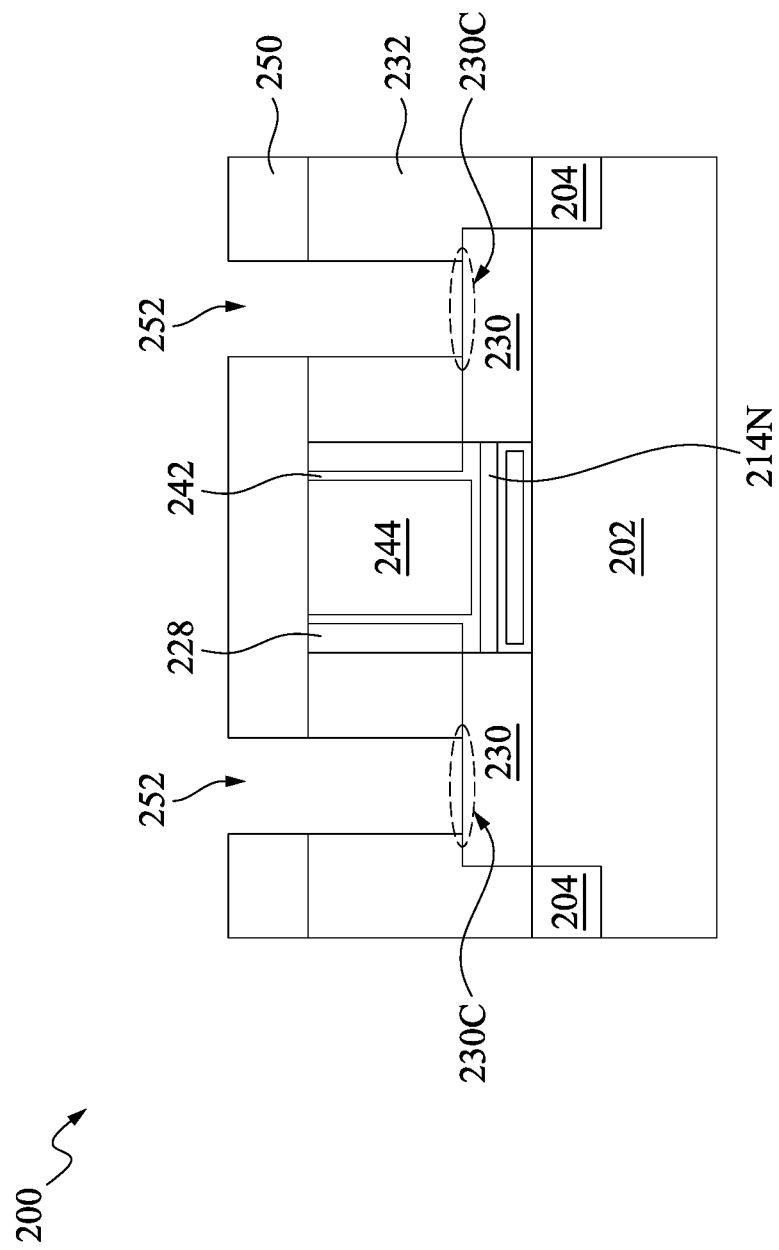
Figure 2J:
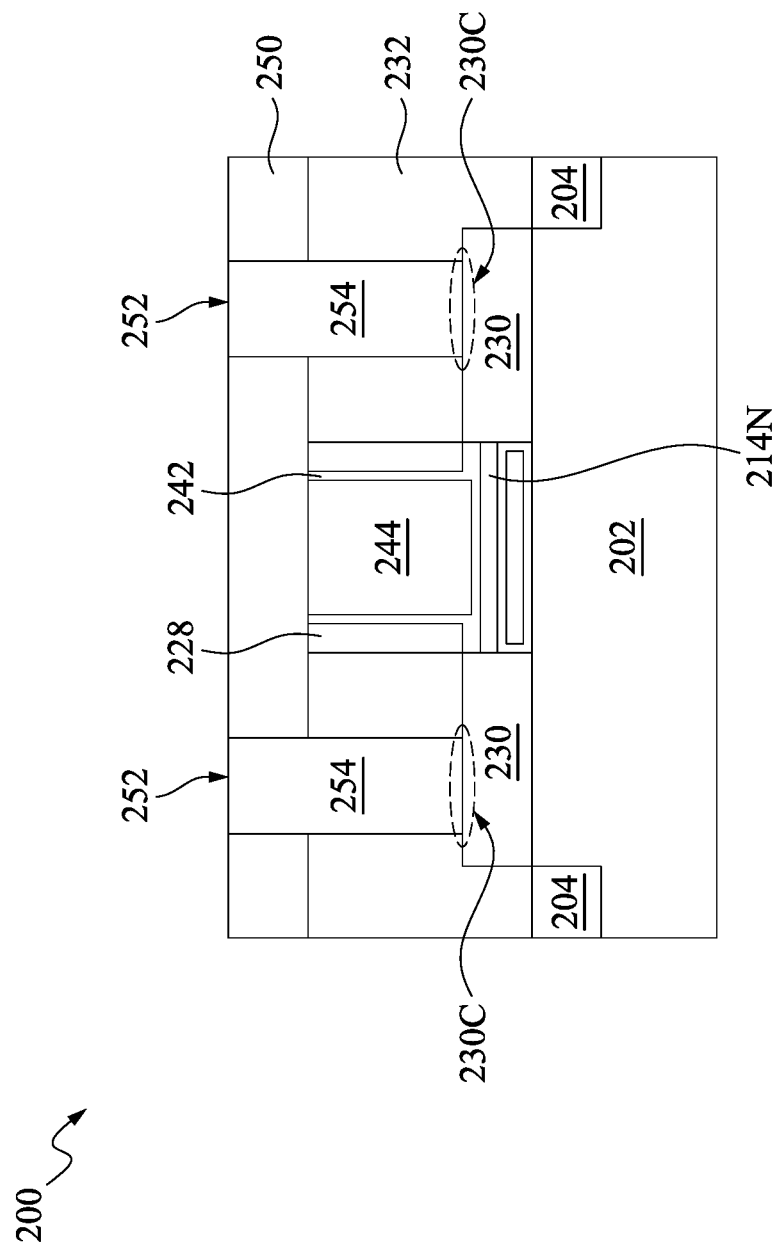
Figure 2K:
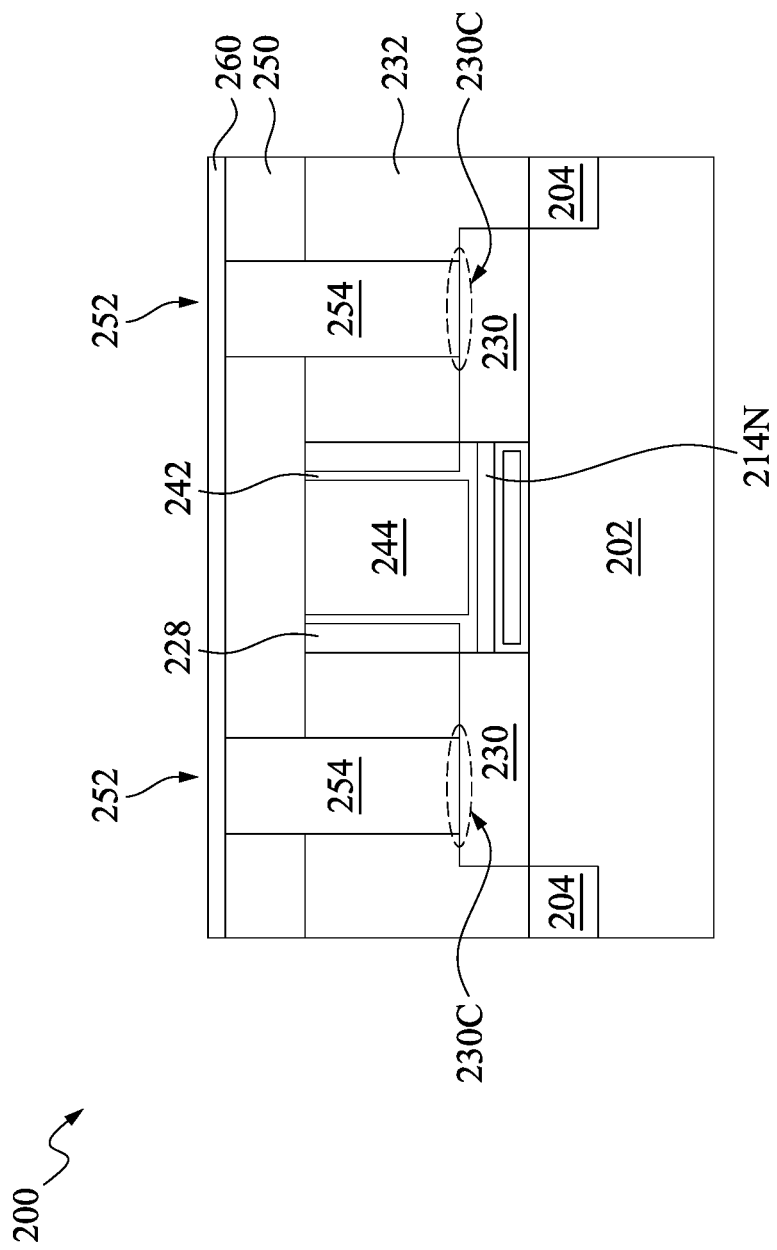
Figure 2L:
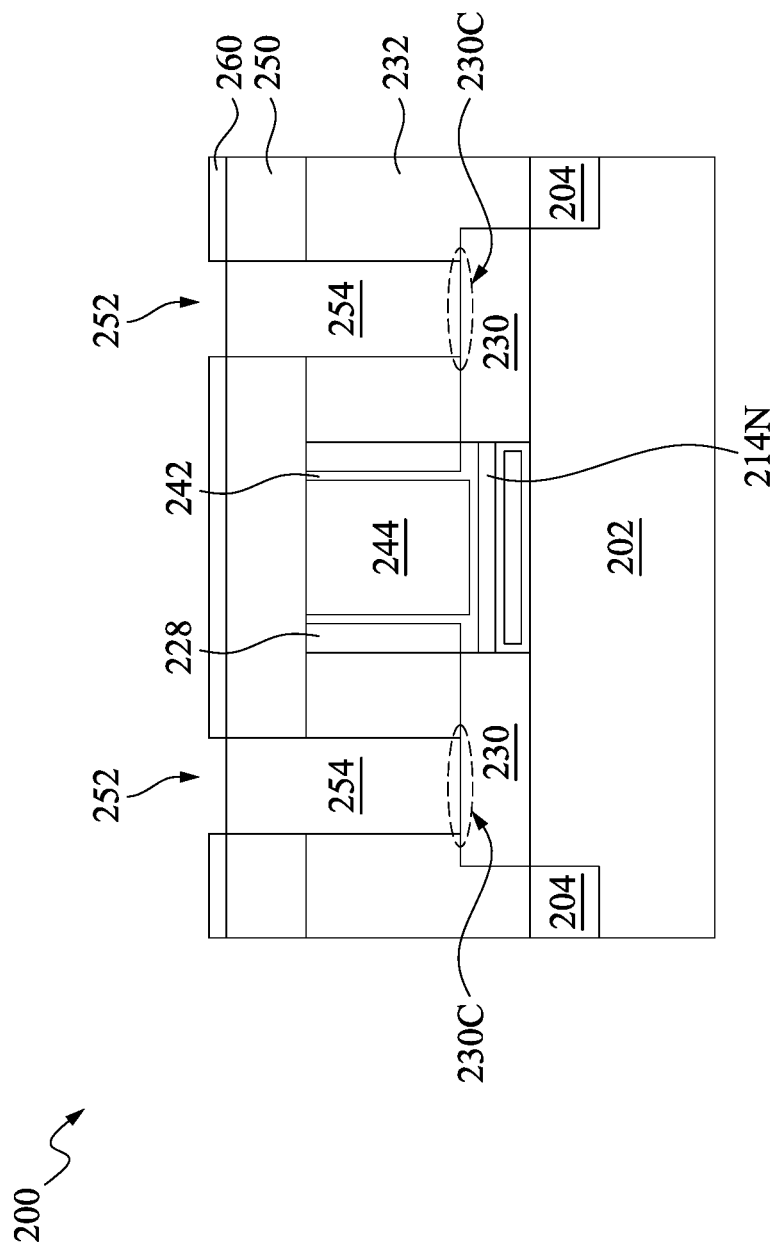
Figure 2M:
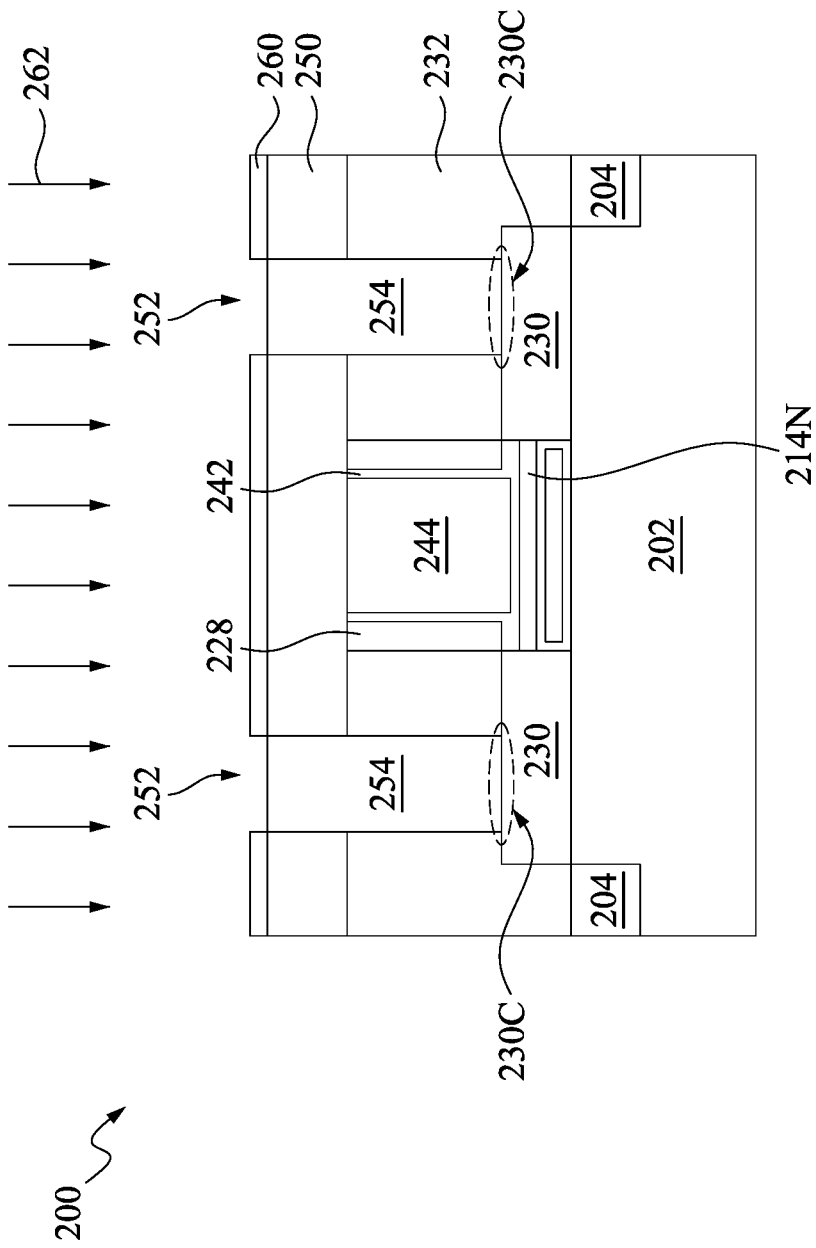
Figure 2N:
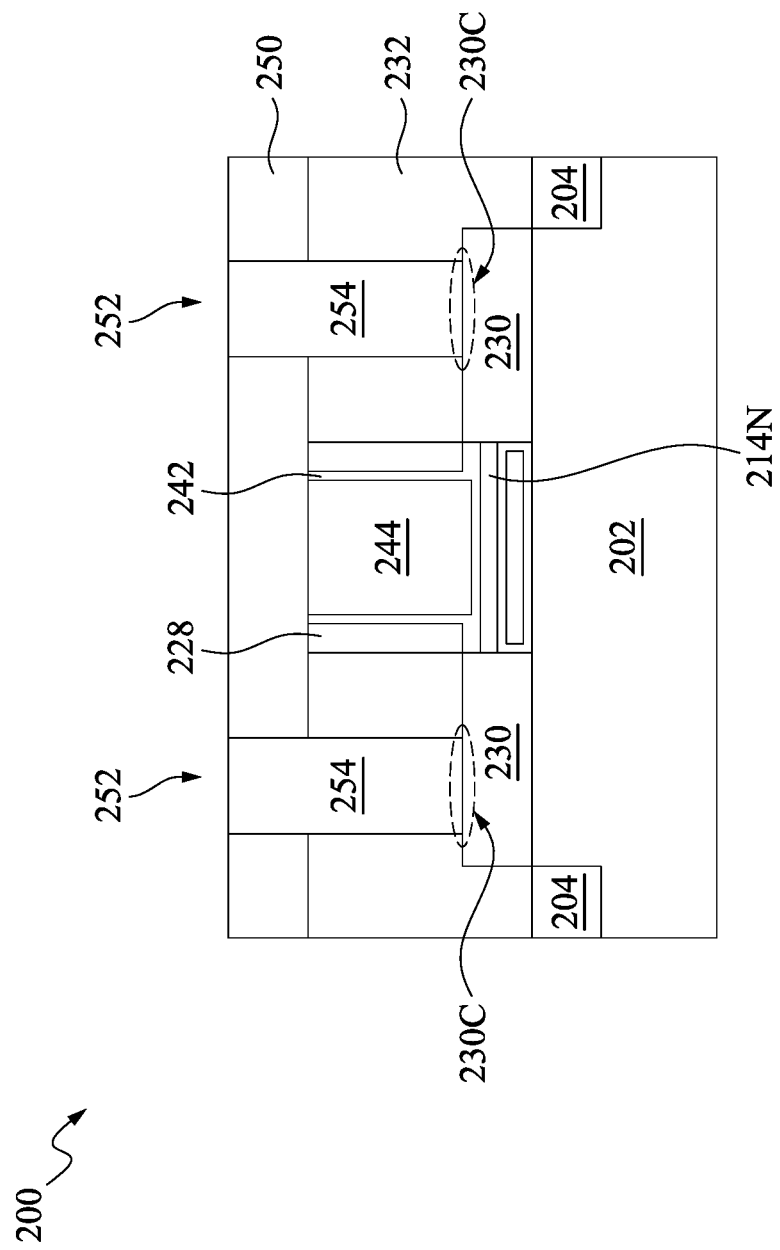
Figure 2O:
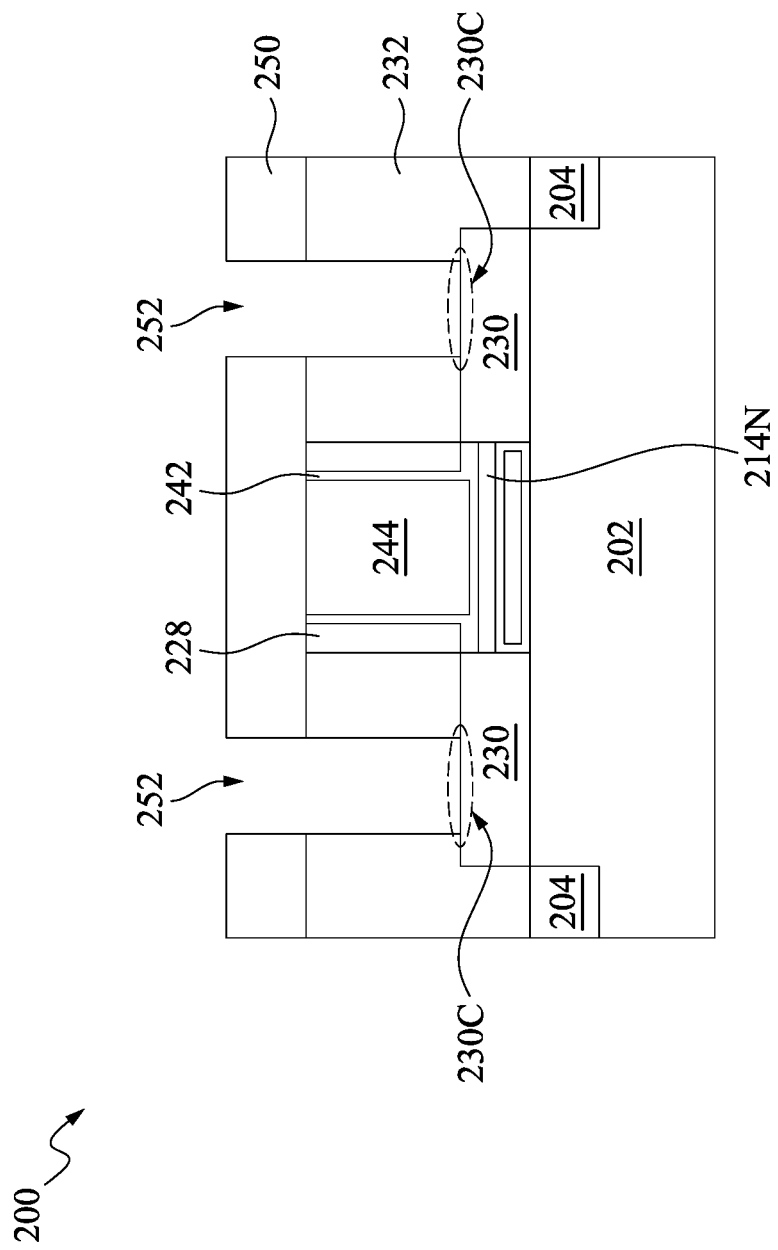
Figure 2P:
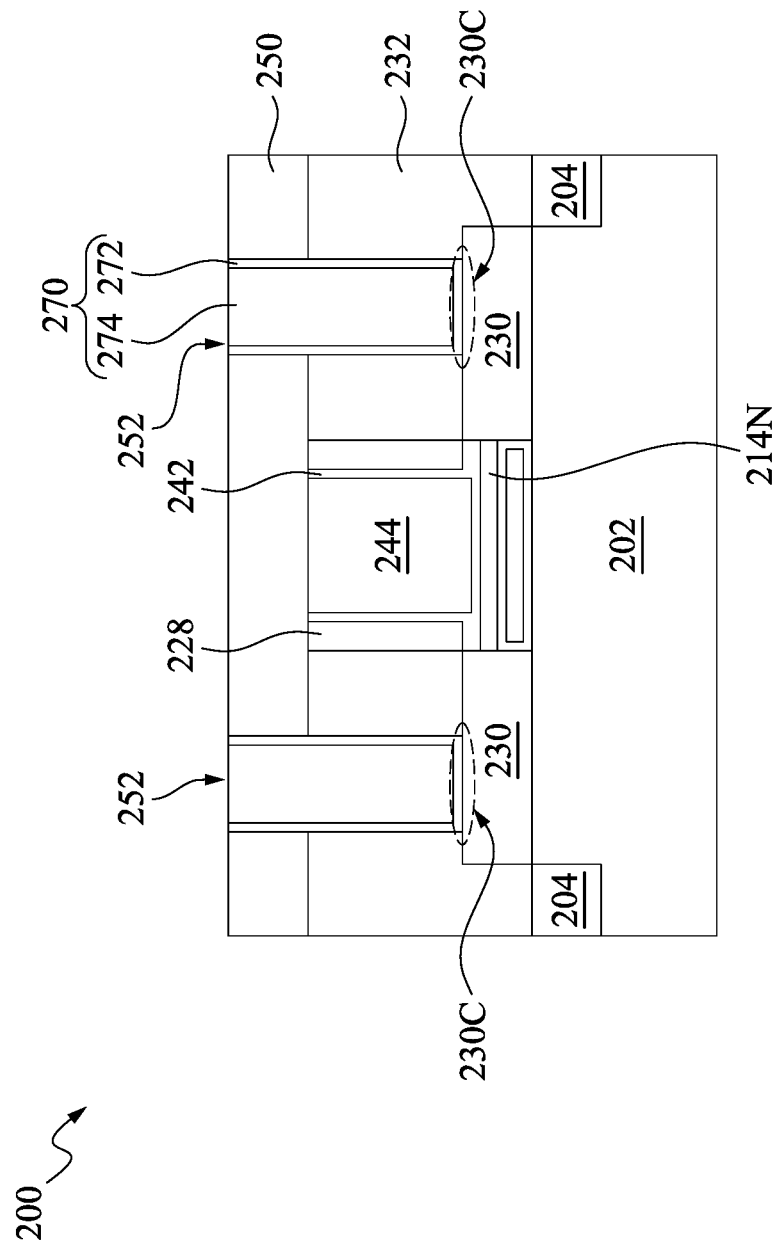

FIG. 1 is a flowchart of a method 100 for fabricating a semiconductor FET device 200, as shown in FIG. 2P, in accordance with some embodiments. FIGS. 2A through 2P are cross-sectional views of the semiconductor FET device 200 at various stages of the fabrication process, in accordance with some embodiments. The method 100 is discussed in detail below, with reference to the semiconductor FET device 200. The flowchart illustrates only a relevant part of the entire manufacturing process for the semiconductor FET device 200. It is understood that additional operations may be provided before, during, and after the operations shown by FIG. 1, and some of the operations described below can be replaced or eliminated for additional embodiments of the method. The order of the operations/processes may be interchangeable.

Referring to FIG. 1, at operation 102 of method 100, a fin structure 210 is fabricated over a substrate 202, as shown in FIG. 2A. The fin structure 210 is formed over the substrate 202 and protrudes from isolation structures 204.

In some embodiments, the substrate 202 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the substrate 202, in some embodiments, has a dopant concentration in a range from $1.0 \times 10^{14}$ atoms/cm$^3$ to $1.0 \times 10^{14}$ atoms/cm$^3$, although the dopant concentrations may be greater or smaller. In some embodiments, the substrate 202 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInAsP. The insulator layer is, for example, a silicon oxide layer, or the like. The insulator layer is provided over a base substrate, typically a silicon or glass substrate.

The fin structure 210 includes alternatively stacked first semiconductor strips 212 and second semiconductor strips 214. In some embodiments and as in FIG. 2A, the fin structure 210 includes a first semiconductor strip 212 and a second semiconductor strip 214 stacked over the first semiconductor strip 212. Although FIG. 2A illustrates a fin structure 210 comprising a single first semiconductor strip 212 and a single second semiconductor strip 214, the fin structure 210 of the present disclosure is not limited to such number of first semiconductor strips 212 and second semiconductor strips 214. Instead, the fin structure 210 of the present disclosure can include any number of second semiconductor strips 214 separated from one another by first semiconductor strips 212. Furthermore, although a single fin structure 210 is illustrated in FIG. 2A, multiple fin structures are contemplated in the present disclosure.

In some embodiments, the first semiconductor strip 212 includes a sacrificial semiconductor material that can be removed selective to a semiconductor material that provides the second semiconductor strip 214. For example, in some embodiments, the first semiconductor strip 212 includes SiGe, and the second semiconductor strip 214 includes Ge. In other embodiments, the first semiconductor strip 212 includes SiGe, and the second semiconductor strip 214 includes Si. In still other embodiments, the first semiconductor strip 212 and the second semiconductor strip 214 includes SiGe with different Ge concentrations.

The fin structure 210 is formed by patterning a material stack (not shown) that includes alternatively stacked first semiconductor material layers and second semiconductor material layers. Each of the first semiconductor material layers and the second semiconductor material layers in the material stack is formed by depositing an appropriate material using an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. Each layer in the material stack, thus, has an epitaxial relationship, i.e., same crystal orientation, as that of the underlying substrate 202. Examples of various epitaxial growth processes that are suitable for use in forming layers in the material stack include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). In some embodiments, the epitaxial growth of the various layers in material stack is performed without breaking vacuum between the various depositions. In some embodiments, the vacuum is broken between any of the various depositions.

In some embodiments, the patterning of the material stack is performed by first applying a mask layer over a topmost surface of the material stack and lithographically patterning the mask layer to provide a patterned mask layer that covers one or more areas where the fin structure(s) 210 are to be formed. In some embodiments, the mask layer is a photoresist layer or a photoresist layer in conjunction with a hardmask layer(s). The material stack is then etched by an anisotropic etch using the patterned mask layer as an etch mask. In some embodiments, the anisotropic etch is a dry etch such as, for example reactive ion etch (ME), a wet etch, or a combination thereof. In some embodiments, the etch stops at approximately the surface of the substrate 202. In some embodiments, the etch proceeds into the substrate 202. A raised substrate portion 202A thus is formed beneath the first semiconductor strip 212 of the fin structure 210. After formation of the fin structure(s) 210, the patterned mask layer is removed, for example, by oxygen plasma. Alternatively, in some embodiments, other methods, such as sidewall image transfer (SIT) or directional self-assembly (DSA), are used to pattern the material stack to provide the fin structure(s) 210.

After forming the fin structure 210, isolation structures 204 is formed surrounding the raised substrate portion 202A such that the fin structure 210 protrudes above the isolation structures 204. In some embodiments, the isolation structures 204 are shallow trench isolation structures formed in the substrate 202. In some embodiments, the isolation structures 204 include silicon oxide, silicon nitride, silicon oxynitride, and/or other suitable insulating material. In some embodiments, the isolation structures 204 include a multi-layer structure, for example, having one or more thermal oxide liner layers disposed on the bottom portion of the raised substrate portion 202A. In some embodiments, the isolation structures 204 are formed by etching trenches in the substrate and filling trenches with an insulating material using suitable deposition processes. In some embodiments, the deposition of the insulating material is performed, for example, by chemical vapor deposition (CVD), plasma enhance chemical vapor deposition (PECVD), or spin coating. In some embodiments, the isolation structures 204 include silicon oxide formed by a flowable CVD process (FCVD) during which a flowable oxide is deposited and a post-deposition anneal is then performed to convert the flowable oxide into silicon oxide. Excess deposited insulating material is subsequently removed from above the topmost surface of the fin structure 210, for example, by a chemical mechanical planarization (CMP) process. After planarization, the top surfaces of the deposited insulating material are coplanar with the topmost surface of the fin structure 210. Next, the deposited insulating material is recessed to provide the isolation structures 204.

Referring to FIG. 1, at operation 104 of method 100, a sacrificial gate structure 220 is formed over the fin structure 210, as shown in FIG. 2B. The sacrificial gate structure 220 includes a sacrificial gate stack (222, 224, 226) straddling a portion of the fin structure 210 and gate spacers 228 on sidewalls of the sacrificial gate stack (222, 224, 226). By "straddling" it is meant that a sacrificial gate stack is formed atop and along sidewalls of the fin structure 210. The term "sacrificial gate stack" as used herein refers to a placeholder structure for a subsequently formed functional gate stack. The term "functional gate stack" as used herein refers to a permanent gate stack used to control output current (i.e., flow of carriers in the channel) of a semiconducting device through electrical fields or magnetic fields. It should be noted that although a single sacrificial gate structure is described and illustrated, multiple sacrificial gate structures are contemplated in the present disclosure.

The sacrificial gate stacks (222, 224, 226) includes, from bottom to top, a sacrificial gate dielectric 222, a sacrificial gate conductor 224, and a sacrificial gate cap 226. In some embodiments, the sacrificial gate dielectric 222 is omitted. In some embodiments, the sacrificial gate stack (222, 224, 226) is formed by first providing a sacrificial material stack (not shown) that includes, from bottom to top, a sacrificial gate dielectric layer if the sacrificial gate dielectric 222 is present, a sacrificial gate conductor layer and a sacrificial gate cap layer, over the fin structure 210 and the substrate 202, and by subsequently patterning the sacrificial material stack.

If present, in some embodiments, the sacrificial gate dielectric layer includes silicon oxide, silicon nitride, or silicon oxynitride. In some embodiments, the sacrificial gate dielectric layer is formed utilizing a deposition process such as, for example, CVD or physical vapor deposition (PVD). In some embodiments, the sacrificial gate dielectric layer is formed by conversion of a surface portion of the fin structure 210 utilizing thermal oxidation or nitridation.

In some embodiments, the sacrificial gate conductor layer includes polysilicon. In some embodiments, the sacrificial gate conductor layer is formed utilizing a deposition process such as, for example, CVD or PECVD.

In some embodiments, the sacrificial gate cap layer includes a dielectric material such as an oxide, a nitride, or an oxynitride. For example, in some embodiments, the sacrificial gate cap layer includes silicon nitride. In some embodiments, the sacrificial gate cap layer is formed utilizing a deposition process such as, for example, CVD or PECVD.

In some embodiments, the sacrificial gate material stack is patterned by lithography and etching. For example, a photoresist layer (not shown) is applied over the topmost surface of the sacrificial material stack and lithographically patterned by lithographic exposure and development. The pattern in the photoresist layer is sequentially transferred into the sacrificial material stack by at least one anisotropic etch. The anisotropic etch is a dry etch, for example ME, a wet etch, or a combination thereof. If not completely consumed, the remaining photoresist layer after formation of the sacrificial gate stack is removed by, for example, ashing.

In some embodiments, the gate spacers 228 include a dielectric material such as, for example, an oxide, a nitride, an oxynitride, or combinations thereof. In some embodiments, the gate spacers 228 comprise silicon nitride. In some embodiments, the gate spacers 228 are formed by first depositing a conformal gate spacer material layer (not shown) on exposed surfaces of the sacrificial gate stack (222, 224, 226), the fin structure 210 and the substrate 202 and then etching the gate spacer material layer to remove horizontal portions of the gate spacer material layer. In some embodiments, the gate spacer material layer is deposited, for example, by CVD, PECVD, or atomic layer deposition (ALD). In some embodiments, the gate spacer material layer is etched by dry etch such as, for example, RIE. Vertical portions of the gate spacer material layer present on the sidewalls of sacrificial gate stack (222, 224, 226) constitute the gate spacers 228.

Referring to FIG. 1, at operation 106 of method 100, a source structure and a drain structure (collectively referred to as source/drain structures 230) are formed on opposite sides of the sacrificial gate structure 220, as shown in FIG. 2C. The source/drain structures 230 are highly doped semiconductor regions with a dopant concentration from about $1 \times 10^{19}$ atoms/cm$^3$ to about $2 \times 10^{21}$ atoms/cm$^3$, although lesser or greater dopant concentrations are also contemplated.

In some embodiments, the source/drain structures 230 are formed by implanting dopants into portions of the fin structure 210 that are not covered by the sacrificial gate structure 220. In some embodiments and when the resulting semiconductor FET device 200 is an n-type FET device, n-type dopants such as phosphorus or arsenic are doped in the source/drain structures 230. In some other embodiments and when the resulting semiconductor FET device 200 is a p-type FET device, p-type dopants such as boron or BF$_2$ are doped in the source/drain structures 230.

Alternatively, the source/drain structures 230 are formed by, for example, epitaxial growth. In some embodiments, the epitaxial source/drain structures function as source/drain stressor to enhance carrier mobility of the semiconductor FET device 200. In some embodiments and when the resulting semiconductor FET device 200 is an n-type FET device, the source/drain structures 230 includes SiP, SiC, SiPC, Si, III-V compound semiconductor materials, or combinations thereof. In some other embodiments and when the resulting semiconductor FET device 200 is a p-type FET device, the source/drain structures 230 includes SiGe, SiGeC, Ge, Si, III-V compound semiconductor materials, or combinations thereof.

In some embodiments, when forming the source/drain structures 230 by epitaxial growth, portions of the fin structure 210 not covered by the sacrificial gate structures 220 are first removed to provide a fin segment 210P beneath the sacrificial gate structures 220. The fin segment 210P includes a first semiconductor segment 212P and a second semiconductor segment 214P, which are remaining portions of the first semiconductor strip 212 and the second semiconductor strip 214, respectively. In some embodiments, the portions of the fin structure 210 that are exposed by the sacrificial gate structure 220 are removed using an anisotropic etch that etches the semiconductor materials of the first semiconductor strip 212 and the second semiconductor strip 214 without substantially affecting the surrounding structures, including the substrate 202, the sacrificial gate cap 226, and the gate spacers 228. In some embodiments, the anisotropic etch is a dry etch, such as RIE. Subsequently, a semiconductor material is epitaxially deposited on exposed semiconductor surfaces such as surface of the substrate 202, the first semiconductor segment 212P, and the second semiconductor segment 214P, but not on dielectric surfaces such as surfaces of the isolation structures 204, the sacrificial gate cap 226, and the gate spacers 228. In some embodiments, when multiple fin structures 210 are present, the epitaxial growth process continues until the deposited semiconductor material merges adjacent fin segments 210P. Depending on the types of the semiconductor FET device 200 being formed (i.e., p-type FET or n-type FET), in the embodiments where the resulting semiconductor FET device 200 is a p-type FET device, the source/drain structures 230 include p-type dopants such as boron or BF$_2$, and in the embodiments where the resulting semiconductor FET device 200 is an n-type FET device, the source/drain structures 230 include n-type dopants such as phosphorous or arsenic. In some embodiments, the source/drain structures 230 are in-situ doped with n-type or p-type dopants during the epitaxial growth. In some embodiments, the source/drain structures 230 are undoped during the epitaxial growth process, and are doped during a subsequent doping process. The subsequent doping process is achieved by an ion implantation, plasma immersion ion implantation, gas and/or solid source diffusion, other suitable processes, and/or combinations thereof. In some embodiments, the source/drain structures 230 include phosphorous doped SiC for an n-type FET device. In some embodiments, the source/drain structures 230 include boron doped SiGe for a p-type FET device.

In some embodiments, the source/drain structures 230 are further exposed to an annealing process to activate the dopants in the source/drain structures 230 after forming the source/drain structures 230 and/or after the subsequent doping process. In some embodiments, the dopants in the source/drain structures 230 are activated by a thermal annealing process including a rapid thermal annealing process, a laser annealing process, or a furnace annealing process.

Referring to FIG. 1, at operation 108 of method 100, an interlevel dielectric (ILD) layer 232 is deposited over the source/drain structures 230 surrounding the sacrificial gate structure 220, as shown in FIG. 2D.

In some embodiments, the ILD layer 232 includes silicon oxide. Alternatively, in some embodiments, the ILD layer 232 includes a low-k dielectric material having a dielectric constant (k) less than 4. In some embodiments, the low-k dielectric material has a dielectric constant from about 1.2 to about 3.5. In some embodiments, the ILD layer 232 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the ILD layer 232 is deposited by CVD, PECVD, PVD, or spin coating. In some embodiments, the ILD layer 232 is deposited to have a top surface above the topmost surface of the sacrificial gate structure 220 (e.g., the top surface of the sacrificial gate cap 226). The ILD layer 232 is subsequently planarized, for example, by CMP and/or a recess etch using the sacrificial gate cap 226 as a polishing and/or etch stop. After the planarization, the ILD layer 232 has a surface substantially coplanar with the topmost surface of the sacrificial gate structure 220.

Referring to FIG. 1, at operation 110 of method 100, the sacrificial gate stack (222, 224, 226) is removed to provide a cavity 234, as shown in FIG. 2E.

Various components of the sacrificial gate stack (222, 224, 226) are removed selectively to the semiconductor materials that provide the respective first semiconductor segment 212P and the second semiconductor segment 214P, and the dielectric materials that provide the respective gate spacers 228 and the ILD layer 232 by at least one etch. In some embodiments, the at least one etch is a dry etch such as RIE, a wet etch such as an ammonia etch, or a combination thereof. The cavity 234 occupies a volume from which the sacrificial gate stack (222, 224, 226) is removed and is laterally confined by inner sidewalls of the gate spacers 228. After removal of the sacrificial gate stack (222, 224, 226), sidewalls of the second semiconductor segment 214P and the underlying first semiconductor segment 212P are physically exposed by the cavity 234.

Referring to FIG. 1, at operation 112 of method 100, a nanostructure such as a nanowire structure 214N is formed to suspend over the substrate 202, as shown in FIG. 2F. It should be noted that although nanowires are described, other nanostructures, such as nanosheets and nanobars, are also contemplated in the present disclosure.

To form the nanowire structure 214N, the first semiconductor segment 212P is removed by etching. In some embodiments, the etch is an isotropic etch that removes the first semiconductor segment 212P selective to the second semiconductor segment 214P, the substrate 202, and the source/drain structures 230, causing the second semiconductor segment 214P to be suspended over the substrate 202. After etching, a gap 236 is formed between the substrate 202 and the second semiconductor segment 214P. Subsequently, the second semiconductor segment 214P is thinned and rounded by performing an annealing process in a hydrogen-containing atmosphere or through oxidation, and thereby provides the nanowire structure 214N. In some embodiments, the nanowire structure 214N has a circular-shaped or an elliptical-shaped cross section. In instances where the fin structure 210 includes multiple first and second semiconductor strips 212, 214, a plurality of vertically stacked nanowire structures are formed (not shown).

Referring to FIG. 1, at operation 114 of method 100, a functional gate stack (242, 244) is formed within the cavity 234 and the gap 236 between the nanowire structure 214N and the substrate 202, as shown in FIG. 2G. The functional gate stack (242, 244) wraps around the nanowire structure 214N, forming a gate all around (GAA) nanowire FET device. In some embodiments, the functional gate stack (242, 244) includes a gate dielectric 242 over exposed surfaces of the nanowires structure 214N and a gate electrode 244 over the gate dielectric 242. The functional gate stack (242, 244) and the gate spacers 228 laterally surrounding the functional gate stack (242, 244) together define a functional gate structure (242, 244, 228).

The functional gate stack (242, 244) includes a first portion within the cavity 234 and a second portion within the gap 236. In the cavity 234, the gate dielectric 242 is U-shaped having a horizontal portion in direct contact with an upper surface of the nanowire structure 214N and vertical portions that are located on exposed sidewalls of the gate spacers 228 laterally surrounding the cavity 234. Within the gap 236, the gate dielectric 242 surrounds the gate electrode 244.

In some embodiments, the gate dielectric 242 includes a high-k dielectric material having a dielectric constant greater than silicon oxide. Exemplary high-k dielectric materials include, but are not limited to, hafnium oxide (HfO2), zirconium oxide (ZrO$_2$), lanthanum oxide (La$_2$O$_3$), aluminum oxide (Al$_2$O$_3$), titanium oxide (TiO$_2$), strontium titanium oxide (SrTiO3), lanthanum Aluminum oxide (LaAlO$_3$), and yttrium oxide (Y$_2$O$_3$). In some embodiments, a multilayered gate dielectric structure comprising different gate dielectric materials, e.g., silicon oxide, and a high-k gate dielectric is formed. In some embodiments, the gate electrode 244 includes a conductive metal such as, for example, tungsten (W), copper (Cu), aluminum (Al), cobalt (Co), or alloys thereof.

To form the functional gate stack (242, 244), a gate dielectric layer is deposited over exposed surfaces of the ILD layer 232, the cavity 234 and the gap 236. In some embodiments, the gate dielectric layer is deposited by a suitable conformal deposition process such as CVD or ALD. A conductive material layer is the deposited over the gate dielectric layer to fill the cavity 234 and the gap 236. In some embodiments, the conductive material layer is deposited by CVD, PECVD, or PVD. A planarization process, such as CMP is performed to remove portions of the conductive material layer and the gate dielectric layer from the top surface of the dielectric layer. The remaining portion of the conductive material layer within the cavity 234 and the gap 236 constitutes the gate electrode 244, and the remaining portion of the gate dielectric layer within the cavity 234 and the gap 236 constitutes the gate dielectric 242.

Referring to FIG. 1, at operation 116 of method 100, a contact level dielectric layer 250 is deposited over the ILD layer 232 and the functional gate structure (242, 244, 228), as shown in FIG. 2H.

In some embodiments, the contact level dielectric layer 250 includes a dielectric material such as, for example, silicon dioxide, TEOS, undoped silicate glass, or doped silicate glass such as BPSG, FSG, PSG, or BSG. In some embodiments, the contact level dielectric layer 250 includes a dielectric material the same as the dielectric material of the ILD layer 232. In some embodiments, the contact level dielectric layer 250 includes a dielectric material different from the dielectric material of the ILD layer 232. In some embodiments, the contact level dielectric layer 250 is deposited, for example, using CVD, PECVD, PVD, or spin coating. In some embodiments, if the contact level dielectric layer 250 is not self-planarizing, a top surface of the contact level dielectric layer 250 is planarized, for example, by CMP. The planarized top surface of the contact level dielectric layer 250 is located above topmost surfaces of the functional gate structures (242, 244, 228).

Referring to FIG. 1, at operation 118 of method 100, source/drain contact openings 252 are formed within the contact level dielectric layer 250 and the ILD layer 232, as shown in FIG. 2I. Each of the source/drain contact openings 252 extends through the contact level dielectric layer 250 and the ILD layer 232, exposing a portion of a corresponding source/drain structure 230. Portions of the source/drain structures 230 that are exposed by respective source/drain contact openings 252 are herein referred to as source/drain contact regions 230C.

In some embodiments, the source/drain contact openings 252 are formed by applying a photoresist layer over the contact level dielectric layer 250, and then lithographically patterning the photoresist layer to form openings therein. Each opening overlies a portion of one of the source/drain structures 230. The pattern in the photoresist layer is transferred through the contact level dielectric layer 250 and the ILD layer 232 using an anisotropic etch to form the source/drain contact openings 252. In some embodiments, a dry etch such as, for example, RIE or plasma etch is performed to remove exposed portions of the contact level dielectric layer 250 and the ILD layer 232. In some embodiments and as shown, the source/drain contact openings 252 are formed to have substantially vertical sidewalls. In some embodiments, the source/drain contact openings 252 are formed to have tapered sidewalls. After formation of the source/drain contact openings 252, the remaining photoresist layer is removed, for example, by ashing.

Referring to FIG. 1, at operation 120 of method 100, conductive plugs 254 are formed in the source/drain contact openings 252, as shown in FIG. 2J. The conductive plugs 254 contact respective source/drain contact regions 230C, and are self-aligned with the source/drain contact regions 230C.

The conductive plugs 254 are formed of a material having good thermal conductivity, and are used as local heat conductors to facilitate conduction of heat from the conductive plugs 254 to respective underlying source/drain contact regions 230C. The presence of the conductive plugs 254 thus helps to increase dopant activation efficiency at the source/drain contact regions 230C. In some embodiments, the thermal conductivity of the conductive plugs 254 is greater than about 1 W/m*K. In addition, the material of high thermal conductivity that provides the conductive plugs 254 is able to absorb laser irradiation and generate heat more efficiently than the case where the laser irradiation is directly incident on the semiconductor regions (i.e., source/drain contact regions 230C), which leads to higher temperature in the source/drain contact regions 230C. The presence of the conductive plugs 254 thus allows using a laser source with less laser energy to activate sufficient amount of dopants in the source/drain contact regions 230C. As a result, the manufacturing cost is reduced.

In some embodiments, the conductive plugs 254 are sacrificial structures and are replaced with functional contact structures, e.g., source/drain contact structures 270 (FIG. 2P) in later process. In some embodiments, the conductive plugs 254 include titanium nitride (TiN), nickel (Ni), or Co.

In some embodiments, the conductive plugs 254 are functional contacts structures for providing electrical connections to the source/drain structures 230 in the semiconductor FET device 200. In some embodiments, the conductive plugs 254 include Cu, W, Al, or an alloy thereof. In some embodiments, each of the conductive plugs 254 is surrounded by a contact liner (not shown) which separates the conductive plug 254 from the contact level dielectric layer 250 and ILD layer 232. In some embodiments, the contact liner includes titanium (Ti), tantalum (Ta), nickel (Ni), ruthenium (Ru), TiN, tantalum nitride (TaN), ruthenium nitride (RuN), an alloy thereof, or a stack thereof such as Ti/TiN or Ta/TaN.

The conductive plugs 254 are formed by filling the source/drain contact openings 252 with a conductive material. In some embodiments, the conductive material is deposited using a deposition technique, such as CVD, PECVD, or PVD. During the deposition process, some amount of the conductive material is deposited over the top surface of the contact level dielectric layer 250. This overburden conductive material is subsequently removed from the top surface of the contact level dielectric layer 250, for example, by a planarization process. In some embodiments, CMP is performed to remove the overburden conductive material. After planarization, the top surfaces of the conductive plugs 254 are substantially coplanar with the top surface of the contact level dielectric layer 250. In some embodiments, before depositing the conductive material for formation of the conductive plugs 254, a contact liner material is deposited along sidewalls and bottom surfaces of the source/drain contact openings 252 to line the conductive plugs 254.

Referring to FIG. 1, at operation 122 of method 100, a light blocking layer 260 is deposited over the contact level dielectric layer 250 and the conductive plugs 254, as shown in FIG. 2K. The light blocking layer 260 is employed to allow the laser irradiation only to penetrate into surface portions of the structure, including surface portions of the conductive plugs 254 and surface portion of the contact level dielectric layer 250, thereby reducing the likelihood of thermal damage to the functional gate structure (242, 244, 228) and the nanowire structure 214N during a laser annealing process subsequently performed for activation of dopants in the source/drain contact regions 230C. The light blocking layer 260 thus protects the underlying FET device components from thermal damage.

In some embodiments, the light blocking layer 260 is an absorption layer configured to absorb incident laser irradiation, thus preventing the laser irradiation from penetrating deeper into regions where the functional gate structure (242, 244, 228) and the nanowire structure 214N are located. In some embodiments, the light blocking layer 260 includes a light absorption material having a relatively high absorption coefficient at the laser irradiation wavelength. In some embodiments, the light blocking layer 260 includes Si, Ge, Al, chromium (Cr), Cu, Au, or iron (Fe).

Alternatively, in some embodiments, the light blocking layer 260 is a reflective layer configured to reflect a least a portion of the incident laser irradiation off the structure, thus preventing the laser irradiation from penetrating deeper into regions where the functional gate structure (242, 244, 228) and the nanowire structure 214N are located. In some embodiments, the light blocking layer 260 includes a light reflective material, such as silver (Ag) or Au.

In some embodiments, the light blocking layer 260 is deposited using a deposition process such as CVD, PECVD, PVD, or ALD. The thickness of the light blocking layer 260 depends on the light blocking mechanism being used. In instances where the light blocking layer 260 is used as an absorption layer, the thickness of the light blocking layer 260 is from about 5 nm to about 10 nm. If the thickness of the light blocking layer 260 is too small, the light blocking layer 260 is unable to sufficiently absorb the laser irradiation so as to prevent the laser irradiation from penetrating deeper to regions where the functional gate structure (242, 244, 228) and nanowire structure 214N are located, and the risk of thermal damage to the functional gate structure (242, 244, 228) and nanowire structure 214N increases, in some instances. If the thickness of the light blocking layer 260 is too great, the laser irradiation is unable to effectively heat the source/drain contact regions 230C, and the total time necessary to achieve the desired dopant activation level is increased, in some instances. In instances where the light blocking layer 260 is used as a reflective layer, the thickness of the light blocking layer 260 is from about 10 nm to about 20 nm. If the thickness of the light blocking layer 260 is too small, the light blocking layer 260 is unable to sufficiently reflect the laser irradiation off the regions where the functional gate structure (242, 244, 228) and nanowire structure 214N are located, and the risk of thermal damage to the functional gate structure (242, 244, 228) and nanowire structure 214N increases, in some instances. If the thickness of the light blocking layer 260 is too great, no further increase in the reflection efficiency occurs, but the material is wasted and production costs increases, in some instances.

Referring to FIG. 1, at operation 124 of method 100, the light blocking layer 260 is etched to remove the light blocking layer 260 from the conductive plugs 254, exposing the conductive plugs 254, as shown in FIG. 2L. After etching, the contact level dielectric layer 250 remains covered by the light blocking layer 260.

The light blocking layer 260 is removed from the conductive plugs 254 by lithography and etching processes. For example, a photoresist layer (not shown) is first applied over the contact level dielectric layer 250 and the conductive plugs 254. The photoresist layer is patterned to form openings, exposing portions of the light blocking layer 260 overlying the conductive plugs 254. The exposed portions of the light blocking layer 260 are removed using an anisotropic etch. In some embodiments, a dry etch such as, for example, RIE or plasma etch, is performed to remove material of the light blocking layer 260 selective to material of the conductive plugs 254. After etching, the conductive plugs 254 are exposed, while regions where the functional gate structures (242, 244, 228) and the nanowire structure 214N are located remain covered by the light blocking layer 260. The remaining photoresist layer is subsequently removed from the structure, for example, by ashing.

Referring to FIG. 1, at operation 126 of method 100, a laser annealing process is performed to activate dopants in the source/drain contact regions 230C, as shown in FIG. 2M. In some embodiments, the laser annealing process is performed using a laser source that directs laser irradiation, as illustrated by arrows 262, to the conductive plugs 254 and the light blocking layer 260. In some embodiments, the laser source is pulsed in a nanosecond duration such that the laser irradiation 262 only penetrates into shallow surface portions of the conductive plugs 254 and the contact level dielectric layer 250. In some embodiments, the penetration depth of the laser irradiation 262 through light blocking layer 260 is controlled to be no greater than 10 nm, thus preventing over-heating the functional gate structure (242, 244, 228) and the nanowire structure 214N.

The laser irradiation 262 that is incident onto the conductive plugs 254 is absorbed by the conductive plugs 254. The absorbed light in the conductive plugs 254 is converted to heat due to the coupling between the incident light and electrons in the conductive plugs 254. The heat is dissipated to the source/drain contact region 230C to activate the dopants in the source/drain contact regions 230C. The conductive plugs 254 thus help to divert more heat to the source/drain contact regions 230C compared to the case where no conductive plugs 254 are present and the laser irradiation 262 is directly incident on the source/drain contact regions 230C. As a result, the dopant activation efficiency is enhanced. In the meanwhile, the laser irradiation 262 that is incident onto the light blocking layer 260 is either absorbed or reflected by the light blocking layer 260, thus preventing the laser irradiation 262 from over-heating the functional gate structure (242, 244, 228) and the nanowire structure 214N. As a result, the thermal damage to the functional gate structure (242, 244, 228) and the nanowire structure 214N is prevented.

In some embodiments, the laser irradiation 262 is performed by irradiating a single laser pulse or a plurality of laser pulses that impinges onto the light blocking layer 260. In some embodiments, the total duration of the single laser pulse or the plurality of laser pulses is less than 200 nanoseconds (ns). In some embodiments, the total duration of the single laser pulse or the plurality of laser pulses is in a range from about 1 ns to about 60 ns.

The wavelength and intensity of the laser irradiation 262 are selected depending on material characteristics of the light blocking layer 260. In instances where the light blocking layer 260 is functioned as an absorption layer, the laser source is chosen such that the laser irradiation 262 has a wavelength at which the light blocking layer 260 has a relatively high absorption coefficient so that the laser irradiation 262 can be sufficiently absorbed by the light blocking layer 260 to prevent the deeper penetration of the laser irradiation 262 into regions where the functional gate structure (242, 244, 228) and the nanowire structure 214N are located. In instances where the light blocking layer 260 is functioned as a reflective layer, the laser source is chosen such that the laser irradiation 262 has a wavelength at which the light blocking layer 260 has a relatively high reflectivity (e.g., >80%) such that the laser irradiation 262 can be effectively reflected by the light blocking layer 260 to prevent deeper penetration of the laser irradiation 262 into regions where the functional gate structure (242, 244, 228) and the nanowire structure 214N are located. As a result, the functional gate structure (242, 244, 228) and the nanowire structure 214N are not over-heated during the laser annealing process, and the thermal damage to the functional gate structure (242, 244, 228) and the nanowire structure 214N caused by the laser annealing is prevented. In some embodiments, the laser irradiation 262 has a wavelength from about 300 nm to about 600 nm. In some embodiments, the energy of the laser irradiation 262 is from about 0.05 J/cm$^2$ to about 0.2 J/cm$^2$. In some embodiments, an excimer laser such as a XeCl laser, a KrF laser is used.

Referring to FIG. 1, at operation 128 of method 100, the light blocking layer 260 is removed from top surface of the contact level dielectric layer 250, as shown in FIG. 2N.

In some embodiments, the light blocking layer 260 is removed using a planarization process, such as CMP. In some embodiments, the light blocking layer 260 is removed by an etch that removes the light blocking layer 260 selective to the conductive plugs 254 and the contact level dielectric layer 250. In some embodiments, a dry etch such as RIE or plasma etch is performed.

Referring to FIG. 1, at operation 130 of method 100, the conductive plugs 254 are removed from the source/drain contact openings 252, re-exposing the source/drain contact regions 230C at the bottoms of the source/drain contact openings 252, as shown in FIG. 2O.

The conductive plugs 254 are removed, for example, by an etch. The etch can be an anisotropic etch or an isotropic etch that removes material of the conductive plugs 254 selective to materials of the contact level dielectric layer 250, the ILD layer 232 and the source/drain contact regions 230C. In some embodiments, the conductive plugs 254 are removed using an ammonia and hydrogen peroxide mixture (APM). In some embodiments, the APM solution includes a mixture of ammonium hydroxide ($NH_4OH$), hydrogen peroxide ($H_2O_2$), and de-ionized water ($H_2O$).

Referring to FIG. 1, at operation 132 of method 100, source/drain contact structures 270 are formed in the source/drain contact openings 252, as shown in FIG. 2P.

In some embodiments, each of the source/drain contact structures 270 includes a contact liner 272 present on sidewall and bottom surfaces of a corresponding source/drain contact opening 252 and a contact plug 274 surrounded by the contact liner 272.

The source/drain contact structures 270 are formed by first depositing a contact liner layer (not shown) along sidewalls and bottom surfaces of the source/drain contact openings 252 and over the top surface of the contact level dielectric layer 250. The contact liner layer includes an elemental metal or a metallic compound that prevents diffusion of metal in the contact plug 274 into the contact level dielectric layer 250 and the ILD layer 232. In some embodiments, the contact liner layer includes Ti, Ta, Ni, Ru, TiN, TaN, RuN, an alloy thereof, or a stack thereof such as Ti/TiN or Ta/TaN. In some embodiments, the contact liner layer is deposited using a conformal deposition process including, for example, CVD, PECVD, PVD, or ALD.

A contact material layer (not shown) is then deposited over the contact liner layer to fill the source/drain contact openings 252. In some embodiments, the contact material layer includes an electrically conductive metal such as, for example, Cu, W, Al, Co, or an alloy thereof. In some embodiments, the contact material layer is formed utilizing a deposition process such as, for example, CVD, PECVD, PVD, or plating. The deposition process is continued until the contact material layer fills the source/drain contact openings 252 and extends above the contact level dielectric layer 250. In some embodiments when Cu or a Cu alloy is employed in the contact material layer, an optional plating seed layer (not shown) is formed on the contact liner layer 272 prior to the formation of the conductive layer. In some embodiments, the optional plating seed layer is formed by a deposition process including, for example, CVD, PECVD, ALD, and PVD.

Subsequently, portions of the contact material layer and the contact liner layer that are located above the top surface of the contact level dielectric layer 250 are removed using a planarization process. In some embodiments, a CMP process is performed. After the planarization, a portion of the contact material layer remaining in each source/drain contact opening 252 constitutes a contact plug 274 and a portion of the contact liner layer remaining in each source/drain contact openings 252 constitutes a contact liner 272. Top surfaces of the contact plug 274 and the contact liner 272 are substantially coplanar with the top surface of the contact level dielectric layer 250.

Replacing the conductive plugs 254 with the source/drain contact structures 270 helps to eliminate any damages to the conductive plugs 254 during the laser anneal process. As a result, the reliability of the semiconductor FET device 200 is increased.

Operations 130 and 132 are optional and in some embodiments are omitted. If operations 130 and 132 are not performed, the conductive plugs 254 serve as source/drain contact structures for the semiconductor FET device 200.

Figure 3:
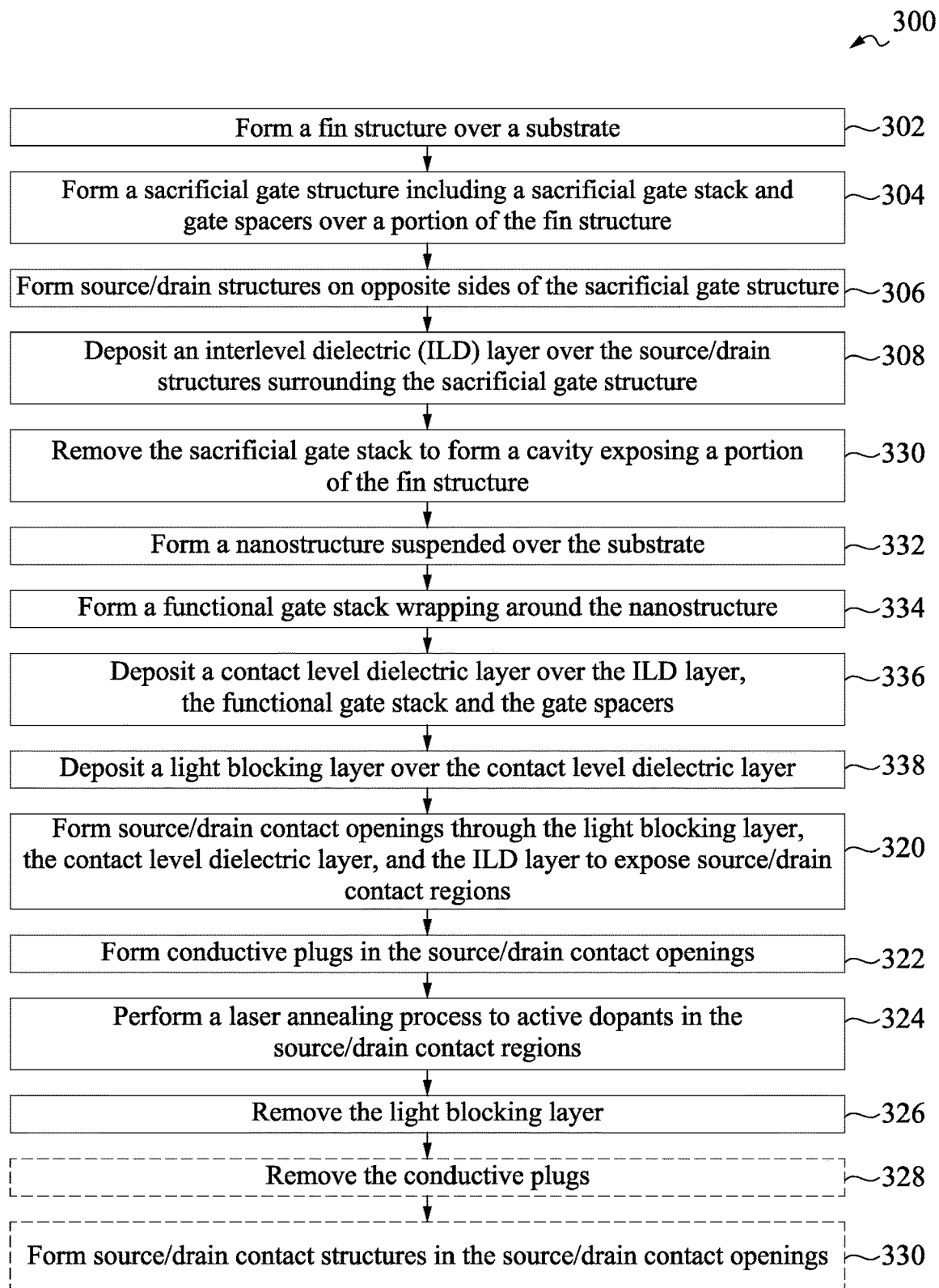
FIG. 3 is a flowchart of a method for fabricating a semiconductor FET device, in accordance with some embodiments.

FIG. 3 is a flowchart of a method 300 for fabricating the semiconductor FET device 200, in accordance with alternative embodiments. FIGS. 4A through 4F are cross-sectional views of the semiconductor FET device 200 at various stages of the fabrication process, in accordance with alternative embodiments. Unless specified otherwise, the materials and formation methods of the components in these embodiments are essentially the same as the like components, which are denoted by like reference numerals in the embodiments shown in FIGS. 2A through 2P. The formation details of the embodiment shown in FIGS. 4A through 4F may, thus, be found in the discussion of the embodiments shown in FIGS. 2A through 2P. The method 300 is discussed in detail below, with reference to the semiconductor FET device 200. The flowchart illustrates only a relevant part of the entire manufacturing process for the semiconductor FET device 200. It is understood that additional operations may be provided before, during, and after the operations shown by FIG. 3, and some of the operations described below can be replaced or eliminated for additional embodiments of the method. The order of the operations/processes may be interchangeable.

The initial steps of method 300 may be essentially the same as shown in FIGS. 2A through 2H. Referring to FIG. 3, at operation 302, a fin structure 210 is fabricated over a substrate 202, as shown in FIG. 2A. At operation 304, a sacrificial gate structure 220 is formed over the fin structure 210, as shown in FIG. 2B. At operation 306, source/drain structures 230 are formed on opposite sides of the sacrificial gate structure 220, as shown in FIG. 2C. At operation 308, an ILD layer 232 is deposited over the source/drain structures 230 surrounding the sacrificial gate structure 220, as shown in FIG. 2D. At operation 310, the sacrificial gate stack (222, 224, 226) is removed to provide a cavity 234, as shown in FIG. 2E. At operation 312, a nanowire structure 214N is formed to suspend over the substrate 202, as shown in FIG. 2F. At operation 314, a functional gate stack (242, 244) is formed within the cavity 234 and the gap 236 between the nanowire structure 214N and the substrate 202, as shown in FIG. 2G. At operation 316, a contact level dielectric layer 250 is deposited over the ILD layer 232 and the functional gate structure (242, 244, 228), as shown in FIG. 2H.

Figure 4A:
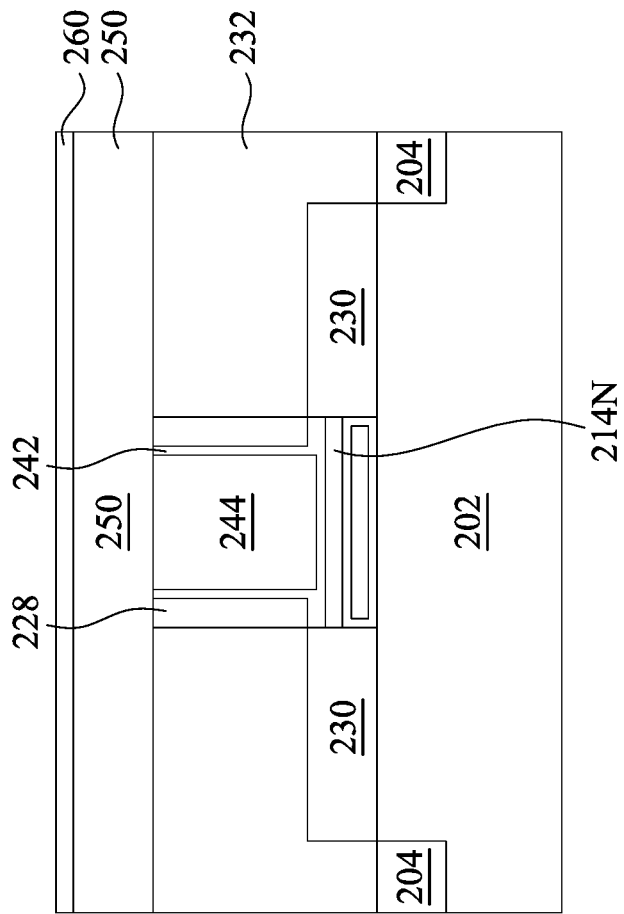
FIGS. 4A-4G are cross-sectional views of a semiconductor FET device at various stages of the fabrication process, in accordance with some embodiments.

Next, referring to FIG. 3, instead of forming source/drain contact openings 252 as in method 100 (FIG. 1), at operation 318 of method 300, a light blocking layer 260 is deposited over the contact level dielectric layer 250, as shown in FIG. 4A. The light blocking layer 260 is employed to allow laser irradiation to penetrate only into surface portions of the contact level dielectric layer 250 and the conductive plug 254 subsequently formed (FIG. 4C), thereby reducing the likelihood of thermal damage to the functional gate structure (242, 244, 228) and the nanowire structure 214N during a laser annealing process subsequently performed to activate dopants in the source/drain contact regions 230C. The processes for formation of the light blocking layer 260 are similar to the processes described above in FIG. 2K and, thus, are not described in detail.

Figure 4B:
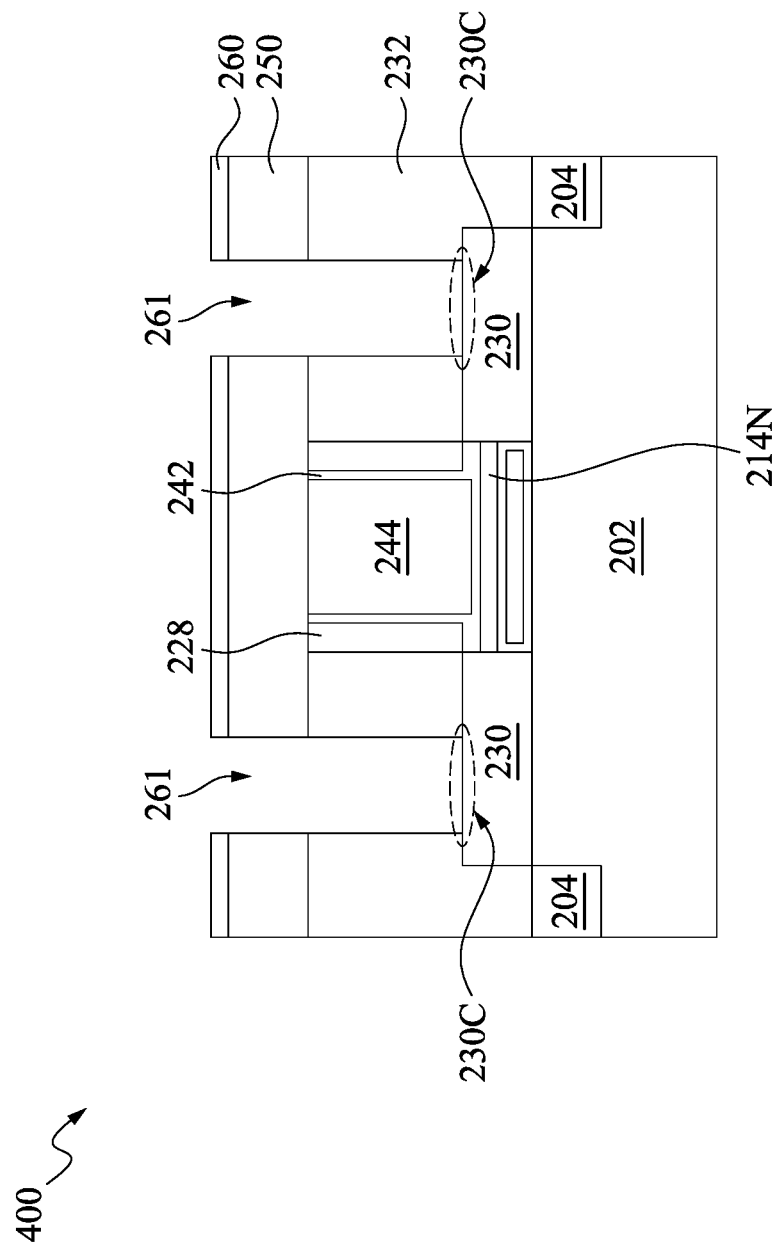

Referring to FIG. 3, at operation 320 of method 300, source/drain contact openings 261 are formed extending through the light blocking layer 260, the contact level dielectric layer 250, and the ILD layer 232, exposing source/drain contact regions 230C, as shown in FIG. 4B.

In some embodiments, the source/drain contact openings 261 are formed by applying a photoresist layer over the light blocking layer 260, and then lithographically patterning the photoresist layer to form openings therein. Each opening overlies a portion of one of the source/drain structures 230. The pattern in the photoresist layer is transferred through the light blocking layer 260, the contact level dielectric layer 250, and the ILD layer 232 using an anisotropic etch to form the source/drain contact openings 261. In some embodiments, a dry etch such as, for example, RIE or plasma etch, is performed to remove exposed portions of the light blocking layer 260, the contact level dielectric layer 250, and the ILD layer 232. In some embodiments and as shown, the source/drain contact openings 261 are formed to have substantially vertical sidewalls. In some embodiments, the source/drain contact openings 261 are formed to have tapered sidewalls. After formation of the source/drain contact openings 261, the remaining photoresist layer is removed, for example, by ashing.

The etching process that forms source/drain contact openings 261 removes the light blocking layer 260 from the source/drain contact regions 230C, while regions where the functional gate structure (242, 244, 228) and the nanowire structure 214N are located remain covered by the light blocking layer 260.

Figure 4C:
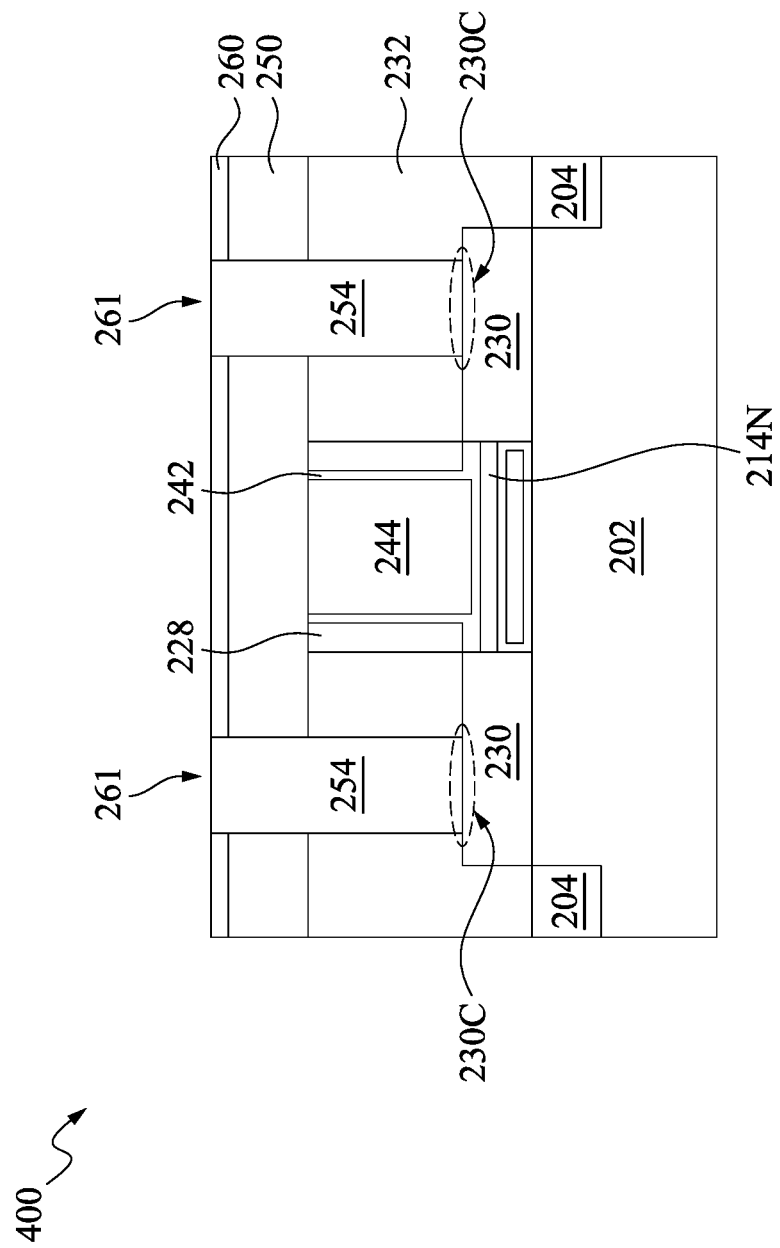

Referring to FIG. 3, at operation 322 of method 300, conductive plugs 254 are formed in the source/drain contact openings 261, as shown in FIG. 4C. In some embodiments, top surfaces of the conductive plugs 254 are above the top surface of the contact level dielectric layer 250 and are substantially coplanar with the top surface of the light blocking layer 260. The processes for formation of the conductive plugs 254 are similar to the processes described above in FIG. 2J and, thus, are not described in detail.

Figure 4D:
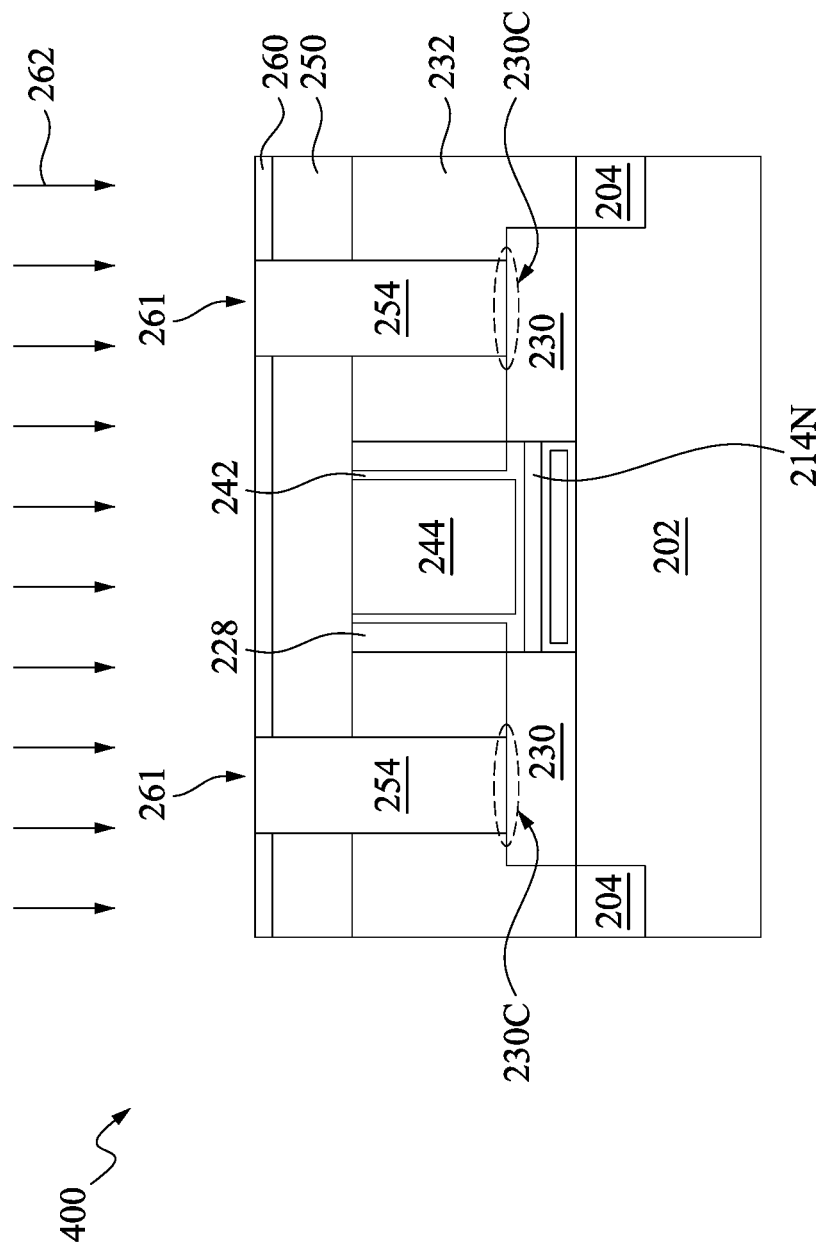

Referring to FIG. 3, at operation 324 of method 300, a laser annealing process is performed to activate dopants in the source/drain contact regions 230C, as shown in FIG. 4D. Details of the laser annealing process is described above in FIG. 2M, and thus are not described in detail.

Figure 4E:
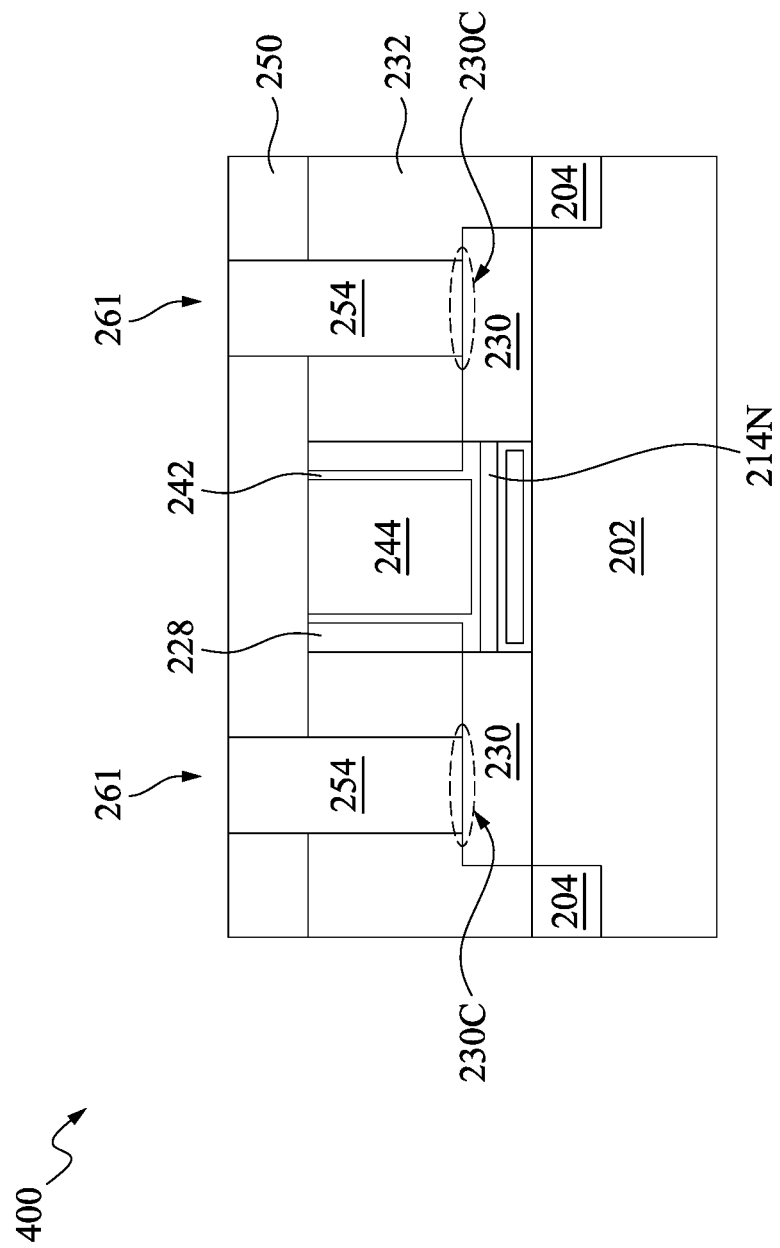

Referring to FIG. 3, at operation 326 of method 300, the light blocking layer 260 is removed, as shown in FIG. 4E. The processes for removal of the light blocking layer 260 are similar to the processes described above in FIG. 2N and, thus, are not described in detail. Subsequently, a planarization process is performed to remove portions of the conductive plugs 254 that are above the top surface of the contact level dielectric layer 250. After the planarization, top surfaces of the conductive plugs 254 are substantially coplanar with the top surface of the contact level dielectric layer 250.

Figure 4F:
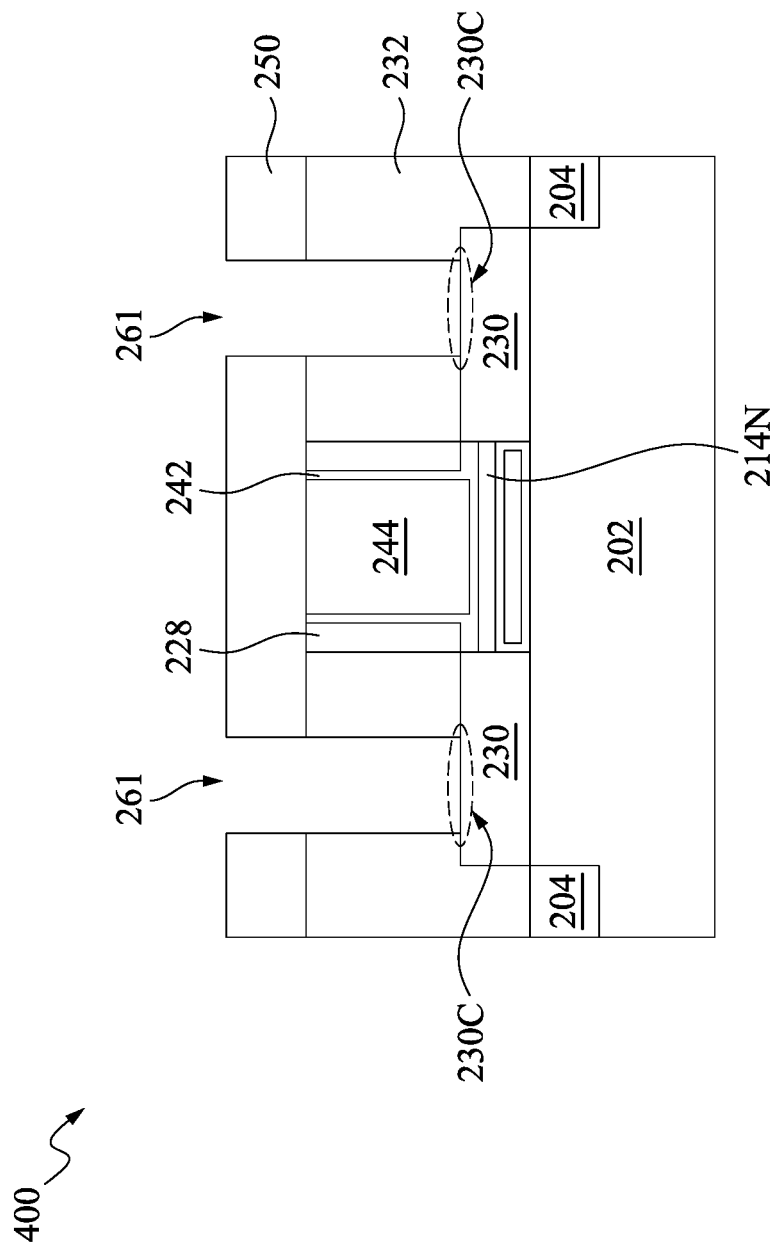

Referring to FIG. 3, at operation 328 of method 300, in instances where the conductive plugs 254 are sacrificial plugs, the conductive plugs 254 are removed for the source/drain contact openings 261, as shown in FIG. 4F. The removal of the conductive plugs 254 re-exposes the source/drain contact regions 230C at the bottoms of the source/drain contact openings 261. The processes for removal of the conductive plugs 254 are similar to the processes described above in FIG. 2O and, thus, are not described in detail.

Figure 4G:
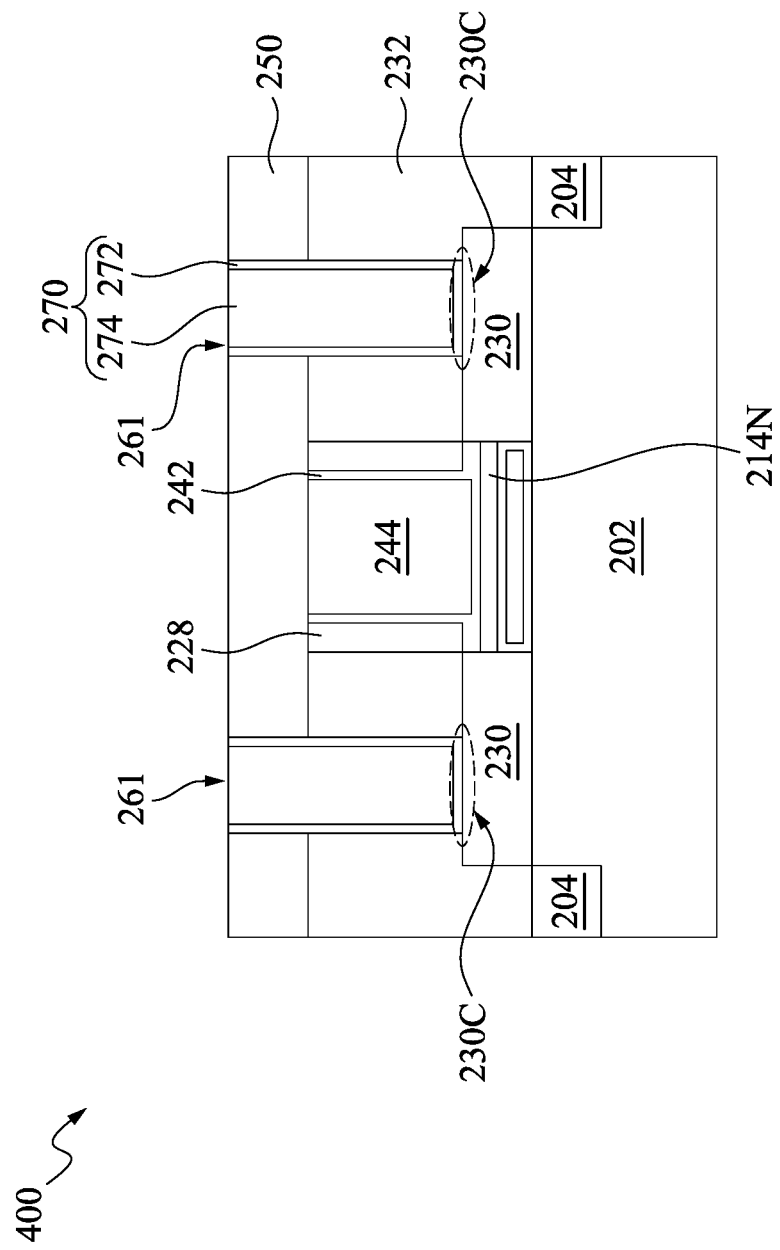

Referring to FIG. 3, at operation 330 of method 300, source/drain contact structures 270 are formed in the source/drain contact openings 261, contacting the source/drain contact regions 230C, as shown in FIG. 4G. The processes for formation of source/drain contact structures 270 are similar to the processes described above in FIG. 2P and, thus, are not described in detail.

Same as method 100, operations 328 and 330 in method 300 are optional and in some embodiment are omitted. If operations 130 and 132 are not performed, the conductive plugs 254 serve as source/drain contact structures for the semiconductor FET device 200.

One aspect of this description relates to a method of forming a semiconductor device. The method includes forming source/drain contact openings extending through at least one dielectric layer to expose source/drain contact regions in source/drain structures. The method further includes forming conductive plugs in the source/drain contact openings. The method further includes depositing a light blocking layer over the conductive plugs and the at least one dielectric layer. The method further includes etching the light blocking layer to expose the conductive plugs. The method further includes directing a laser irradiation to the conductive plugs and the light blocking layer. The laser irradiation is configured to activate dopants in the source/drain contact regions. In some embodiments, forming the conductive plugs in the source/drain contact openings includes depositing titanium nitride, nickel, or cobalt to fill the source/drain contact openings. In some embodiments, the method further includes removing the light blocking layer. In some embodiments, the method further includes removing the conductive plugs from the source/drain contact openings. In some embodiments, removing the conductive plugs includes applying an ammonia hydrogen peroxide mixture to the conductive plugs. In some embodiments, the method further includes forming source/drain contact structures in the source/drain contact openings. In some embodiments, forming the source/drain contact structures includes depositing a contact liner layer along sidewalls and bottom surfaces of the source/drain contact openings and over a topmost surface of the at least one dielectric layer, depositing a contact material layer over the contact liner layer to fill the source/drain contact openings, and removing portions of the contact material layer and the contact liner layer from the topmost surface of the at least one dielectric layer. In some embodiments, directing the laser irradiation includes directing the laser irradiation from a nanosecond laser source. In some embodiments, forming the source/drain contact openings includes performing an anisotropic etch process to etch the at least one dielectric layer. In some embodiments, depositing the light blocking layer includes depositing a light absorption material. In some embodiments, depositing the light blocking layer includes depositing a light reflective material.

Another aspect of this description relates to a method of forming a semiconductor device. The method includes forming a field effect transistor (FET) device over a substrate. The FET device includes a nanostructure channel, a gate structure around the nanostructure channel, and source/drain structures on opposite sides of the gate structure. The gate structure is surrounded by a first dielectric layer. The method further includes depositing a second dielectric layer over the gate structure and the first dielectric layer. The method further includes depositing a light blocking layer over the second dielectric layer. The method further includes etching the light blocking layer, the second dielectric layer, and the first dielectric layer to form source/drain contact openings. The source/drain contact openings expose source/drain contact regions of the source/drain structures. The method further includes forming conductive plugs in the source/ drain contact openings. The method further includes performing a laser annealing process to activate dopants in the source/drain contact regions by directing a laser irradiation to the conductive plugs and the light blocking layer. The method further includes removing the light blocking layer. In some embodiments, each of the conductive plugs includes copper, tungsten, aluminum, or an alloy thereof. In some embodiments, each of the conductive plugs includes titanium nitride, nickel, or cobalt. In some embodiments, the method further includes replacing the conductive plugs with source/drain contact structures. In some embodiments, depositing the light blocking layer includes depositing a light absorption material comprising silicon, germanium, aluminum, chromium, copper, gold, or iron. In some embodiments, depositing the light blocking layer comprises depositing a light reflective material comprising silver or gold.

Still another aspect of this description relates to a method of forming a semiconductor device. The method includes forming a field effect transistor (FET) device over a substrate. The FET device includes a channel region, a gate structure wrapping around the channel region, and source/ drain structures on opposite sides of the gate structure. The method further includes forming a first dielectric layer over the source/drain structures and the substrate, the first dielectric layer surrounding the gate structure. The method further includes depositing a second dielectric layer over the gate structure and the first dielectric layer. The method further includes depositing a light blocking layer over the second dielectric layer. The method further includes etching the light blocking layer, the second dielectric layer, and the first dielectric layer to form source/drain contact openings. The source/drain contact openings expose source/drain contact regions of the source/drain structures. The method further includes forming conductive plugs in the source/drain contact openings. The method further includes directing a laser irradiation to the conductive plugs and the light blocking layer to activate dopants in the source/drain contact regions. The method further includes removing the light blocking layer. The method further includes removing the conductive plugs from the source/drain contact openings. The method further includes forming source/drain contact structures in the source/drain contact openings. In some embodiments, forming the conductive plugs comprises depositing a thermally conductive material to fill the source/drain contact openings, and removing the deposited thermally conductive material from a top surface of light blocking layer. In some embodiments, depositing the light blocking layer includes depositing a light absorption material or a light reflective material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
   forming source/drain contact openings extending through at least one dielectric layer to expose portions of source/drain structures on opposite sides of a gate structure;
   forming source/drain contact structures in the source/drain contact openings;
   depositing a light blocking layer in direct contact with top surfaces of the source/drain contact structures and a top surface of the at least one dielectric layer;
   etching the light blocking layer to expose the top surfaces of the source/drain contact structures, wherein the gate structure remains covered by a remaining portion of the light blocking layer,
   wherein etching the light blocking layer comprises:
      forming a photoresist layer over the light blocking layer;
      patterning the photoresist layer to form openings therein to expose portions of the light blocking layer overlying the source/drain contact structures; and
      removing the exposed portions of the light blocking layer by an anisotropic etching process; and
   performing a laser annealing process to activate dopants in the source/drain structures.

2. The method of claim 1, wherein performing the laser annealing process comprises irradiating the source/drain contact structures and the remaining portion of the light blocking layer with a laser radiation.

3. The method of claim 2, wherein the laser radiation has a wavelength from about 300 nm to about 600 nm.

4. The method of claim 2, wherein the laser radiation has an energy from about 0.05 J/cm$^2$ to about 0.2 J/cm$^2$.

5. The method of claim 1, wherein performing the laser annealing process comprises irradiating the source/drain contact structures and the remaining portion of the light blocking layer with a single laser pulse or a plurality of laser pulses having a duration from about 1 ns to about 60 ns.

6. The method of claim 1, wherein the light blocking layer comprises a light absorption material.

7. The method of claim 6, wherein the light absorption material comprises silicon, germanium, aluminum, chromium, copper, gold or iron.

8. The method of claim 1, wherein the light blocking layer comprises a light reflective material.

9. The method of claim 8, wherein the light reflective material comprises silver or gold.

10. The method of claim 1, further comprising removing the remaining portion of the light blocking layer after performing the laser annealing process.

11. A method for forming a semiconductor device, comprising:
    forming a field effect transistor (FET) device over a substrate, the FET device comprising a nanostructure channel suspended from the substrate, a gate structure surrounding the nanostructure channel, and source/drain structures adjacent to the nanostructure channel;
    forming a first dielectric layer over the substrate to surround the gate structure;
    depositing a second dielectric layer over the gate structure and the first dielectric layer;
    forming conductive plugs within the first dielectric layer and the second dielectric layer to contact the source/drain structures;
    forming a patterned light blocking layer over the second dielectric layer to cover the gate structure, while exposing top surfaces of the conductive plugs, wherein the patterned light blocking layer is in direct contact with a top surface of the second dielectric layer;
    irradiating the conductive plugs and the patterned light blocking layer with a laser radiation to activate dopants in portions of the source/drain structures underlying the conductive plugs;
    removing the conductive plugs after the irradiation; and
    forming source/drain contact structures within the first and second dielectric layers to contact the source/drain structures.

12. The method of claim 11, further comprising removing the patterned light blocking layer to re-expose the gate structure.

13. The method of claim 11, wherein the patterned light blocking layer absorbs the laser radiation.

14. The method of claim 11, wherein the patterned light blocking layer reflects the laser radiation.

15. The method of claim 11, wherein removing the conductive plugs comprises performing an anisotropic etch or an isotropic etch to the conductive plugs.

16. The method of claim 15, wherein the conductive plugs are removed using a mixture of ammonia and hydrogen peroxide.

17. A method for forming a semiconductor device, comprises:
    forming a gate structure surrounding a nanostructure channel over a substrate;
    forming source/drain structures adjacent to the nanostructure channel;
    depositing a dielectric layer to cover the source/drain structures and the gate structure;
    etching the dielectric layer to form source/drain contact openings, the source/drain contact openings exposing portions of the source/drain structures;
    forming conductive plugs in the source/drain contact openings;
    deposing a light blocking layer in direct contact with a top surface of the dielectric layer and top surfaces of the conductive plugs;
    etching the light blocking layer to form openings exposing the conductive plugs but not the gate structure;
    irradiating the conductive plugs and a remaining portion of the light blocking layer; and
    removing the remaining portion of the light blocking layer from the top surface of the dielectric layer,
    wherein etching the light blocking layer comprises:
       forming a photoresist layer over the light blocking layer;
       patterning the photoresist layer to form openings therein to expose portions of the light blocking layer overlying the conductive plugs; and
       removing the exposed portions of the light blocking layer by an anisotropic etching process.

18. The method of claim 17, wherein the light blocking layer comprises silicon, germanium, aluminum, chromium, copper, gold, iron or silver.

19. The method of claim 18, wherein the light blocking layer has a thickness ranging from about 5 nm to about 10 nm.

20. The method of claim 17, further comprising replacing the conductive plugs with source/drain contact structures after irradiating the conductive plugs.

* * * * *